US012651844B2

(12) United States Patent
Kwon et al.

(10) Patent No.: US 12,651,844 B2
(45) Date of Patent: Jun. 9, 2026

(54) ELECTRONIC DEVICE INCLUDING EMI ABSORBER

(71) Applicant: Samsung Electronics Co., Ltd., Suwon-si (KR)

(72) Inventors: Eunbae Kwon, Suwon-si (KR); Changrim Yu, Suwon-si (KR); Jongmin Kim, Suwon-si (KR); Joseph Kang, Suwon-si (KR); Kwonsik Min, Suwon-si (KR); Jihwan Oh, Suwon-si (KR); Kyonghwan Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 350 days.

(21) Appl. No.: 18/332,322

(22) Filed: Jun. 9, 2023

(65) Prior Publication Data
US 2023/0344140 A1 Oct. 26, 2023

Related U.S. Application Data

(63) Continuation of application No. PCT/KR2023/005494, filed on Apr. 21, 2023.

(30) Foreign Application Priority Data

Apr. 21, 2022 (KR) ........................ 10-2022-0049698
Jun. 10, 2022 (KR) ........................ 10-2022-0070924

(51) Int. Cl.
*H01Q 17/00* (2006.01)
*H01Q 1/52* (2006.01)
(Continued)

(52) U.S. Cl.
CPC ............. *H01Q 17/007* (2013.01); *H01Q 1/52* (2013.01); *H04M 1/02* (2013.01); *H04M 1/0264* (2013.01);
(Continued)

(58) Field of Classification Search
None
See application file for complete search history.

(56) References Cited

U.S. PATENT DOCUMENTS 9,930,229 B2 * 3/2018 Zhao ...................... H05K 1/181
10,477,082 B2 11/2019 Jung et al.
(Continued)

FOREIGN PATENT DOCUMENTS

CN 106936460 A 7/2017
CN 112888282 A 6/2021
(Continued)

OTHER PUBLICATIONS

International Search Report dated Jul. 27, 2023, issued in International Application No. PCT/KR2023/005494.
(Continued)

*Primary Examiner* — Vladimir Magloire
*Assistant Examiner* — Ashley Brown Raynal
(74) *Attorney, Agent, or Firm* — Jefferson IP Law, LLP

(57) ABSTRACT

An electronic device is provided. The electronic device includes a housing including a front surface plate, a rear surface plate, and a side surface portion providing a side surface, a first support positioned between the front surface plate and the rear surface plate and connected to the side surface portion, a display, a wireless communication circuit configured to transmit or receive a signal through an antenna radiator, camera circuitry positioned between the first support and the rear surface plate, and a conductive pattern positioned between the first support and the rear surface plate and at least partially overlapping with the camera circuitry when viewed from a top of the rear surface plate, and electrically connected to a ground of the electronic device.

13 Claims, 12 Drawing Sheets

(51) Int. Cl.

| | | |
|---|---|---|
| *H04M 1/02* | (2006.01) | |
| *H04N 23/12* | (2023.01) | |
| *H05K 1/02* | (2006.01) | |
| *H05K 1/181* | (2026.01) | |
| *H05K 5/10* | (2025.01) | |

(52) U.S. Cl.

CPC ........... *H04N 23/12* (2023.01); *H05K 1/0287* (2013.01); *H05K 1/181* (2013.01); *H05K 5/10* (2025.01); *H05K 2201/10098* (2013.01); *H05K 2201/10128* (2013.01)

(56) References Cited

U.S. PATENT DOCUMENTS

| | | | |
|---|---|---|---|
| 10,620,669 | B2 | 4/2020 | Kim et al. |
| 10,996,713 | B2 | 5/2021 | Pakula et al. |
| 11,152,716 | B2 | 10/2021 | Shin et al. |
| 11,405,540 | B2 | 8/2022 | Lee et al. |
| 12,262,736 | B1 * | 4/2025 | Johns .............. H04M 1/724092 |
| 2019/0280375 | A1 * | 9/2019 | Ahn ......................... H01Q 1/38 |
| 2020/0220954 | A1 | 7/2020 | Hebert et al. |
| 2021/0028543 | A1 * | 1/2021 | Yeom ...................... H01Q 5/30 |
| 2022/0086328 | A1 | 3/2022 | Yu et al. |

FOREIGN PATENT DOCUMENTS

| | | | | | |
|---|---|---|---|---|---|
| CN | 114171919 | A | * | 3/2022 | ............. H01Q 1/526 |
| EP | 4 044 783 | A1 | | 8/2022 | |
| JP | 6218910 | B1 | | 10/2017 | |
| KR | 10-2016-0034076 | A | | 3/2016 | |
| KR | 10-2017-0020139 | A | | 2/2017 | |
| KR | 10-2020-0101013 | A | | 8/2020 | |
| KR | 20200101013 | A | * | 8/2020 | ............. H01Q 21/00 |
| KR | 10-2294949 | B1 | | 8/2021 | |
| KR | 10-2022-0015693 | A | | 2/2022 | |
| WO | 2018/117429 | A1 | | 6/2018 | |
| WO | 2020/047754 | A1 | | 3/2020 | |
| WO | 2020/153738 | A1 | | 7/2020 | |

OTHER PUBLICATIONS

European Search Report dated May 13, 2025, issued in European Application No. 23792251.3-1201.

* cited by examiner

FIG. 6

ELECTRONIC DEVICE INCLUDING EMI ABSORBER

CROSS-REFERENCE TO RELATED APPLICATION(S)

This application is a continuation application, claiming priority under § 365(c), of an International application No. PCT/KR2023/005494, filed on Apr. 21, 2023, which is based on and claims the benefit of a Korean patent application number 10-2022-0049698, filed on Apr. 21, 2022, in the Korean Intellectual Property Office, and of a Korean patent application number 10-2022-0070924, filed on Jun. 10, 2022, in the Korean Intellectual Property Office, the disclosure of each of which is incorporated by reference herein in its entirety.

TECHNICAL FIELD

The disclosure relates to an electronic device including an electromagnetic interference (EMI) absorber.

BACKGROUND ART

As electronic devices such as smartphones have expanded the range of applications available, the number of antennas that the electronic devices include has increased. While the electronic devices are slimming down, electrical constituent elements are being added for various functions.

The information described above may be provided as the related art for the purpose of enhancing the understanding of the disclosure. No assertion or determination is made with respect to the applicability of any of the above-mentioned as the prior art related to the disclosure.

The above information is presented as background information only to assist with an understanding of the disclosure. No determination has been made, and no assertion is made, as to whether any of the above might be applicable as prior art with regard to the disclosure.

DISCLOSURE OF INVENTION

Technical Problem

There may be electromagnetic interference between an antenna and other electrical constituent elements in the vicinity of the antenna.

Aspects of the disclosure are to address at least the above-mentioned problems and/or disadvantages and to provide at least the advantages described below. Accordingly, an aspect of the disclosure is to provide an electronic device including an EMI absorber that is capable of reducing electromagnetic interference between the antenna and other electrical constituent elements in the vicinity of the antenna.

Additional aspects will be set forth in part in the description which follows and, in part, will be apparent from the description, or may be learned by practice of the presented embodiments.

Solution to Problem

In accordance with an aspect of the disclosure, an electronic device is provided. The electronic device includes a housing, a first support, a display, a wireless communication circuit, a camera module, and a conductive pattern. The housing includes a front surface plate configured to provide a front surface of the electronic device, a rear surface plate configured to provide a rear surface of the electronic device, and a side surface portion configured to provide a side surface of the electronic device. The first support is positioned between the front surface plate and the rear surface plate, and may be connected to the side surface portion. The display is positioned between the front surface plate and the first support, and may be visually visible through the front surface plate. A wireless communication circuit may be constituted to transmit or receive a signal in a selected or designated frequency band through an antenna radiator. The camera module may be positioned between the first support and the rear surface plate. The conductive pattern may be positioned between the first support and the rear surface plate. The conductive pattern may be at least partially overlapped with the camera module, when viewed from the top of the rear surface plate. The conductive pattern may be electrically connected to a ground of the electronic device. Some of electromagnetic waves, travel toward the camera module, among the electromagnetic waves radiating from the antenna radiator, may flow to the ground through the conductive pattern.

Advantageous Effects of Invention

The electronic device including an EMI absorber according to an example embodiment of the disclosure may reduce electromagnetic interference between an antenna and other electrical constituent elements in the vicinity of the antenna (e.g., a camera module), thereby reducing degradation of the antenna radiation performance or performance of the electrical constituent elements in the vicinity of the antenna, or malfunction of the electrical constituent elements in the vicinity of the antenna.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which:

FIG. 6 is a view of a portion of the electronic device according to an embodiment of the disclosure;

Throughout the drawings, it should be noted that like reference numbers are used to depict the same or similar elements, features, and structures.

MODE FOR THE INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
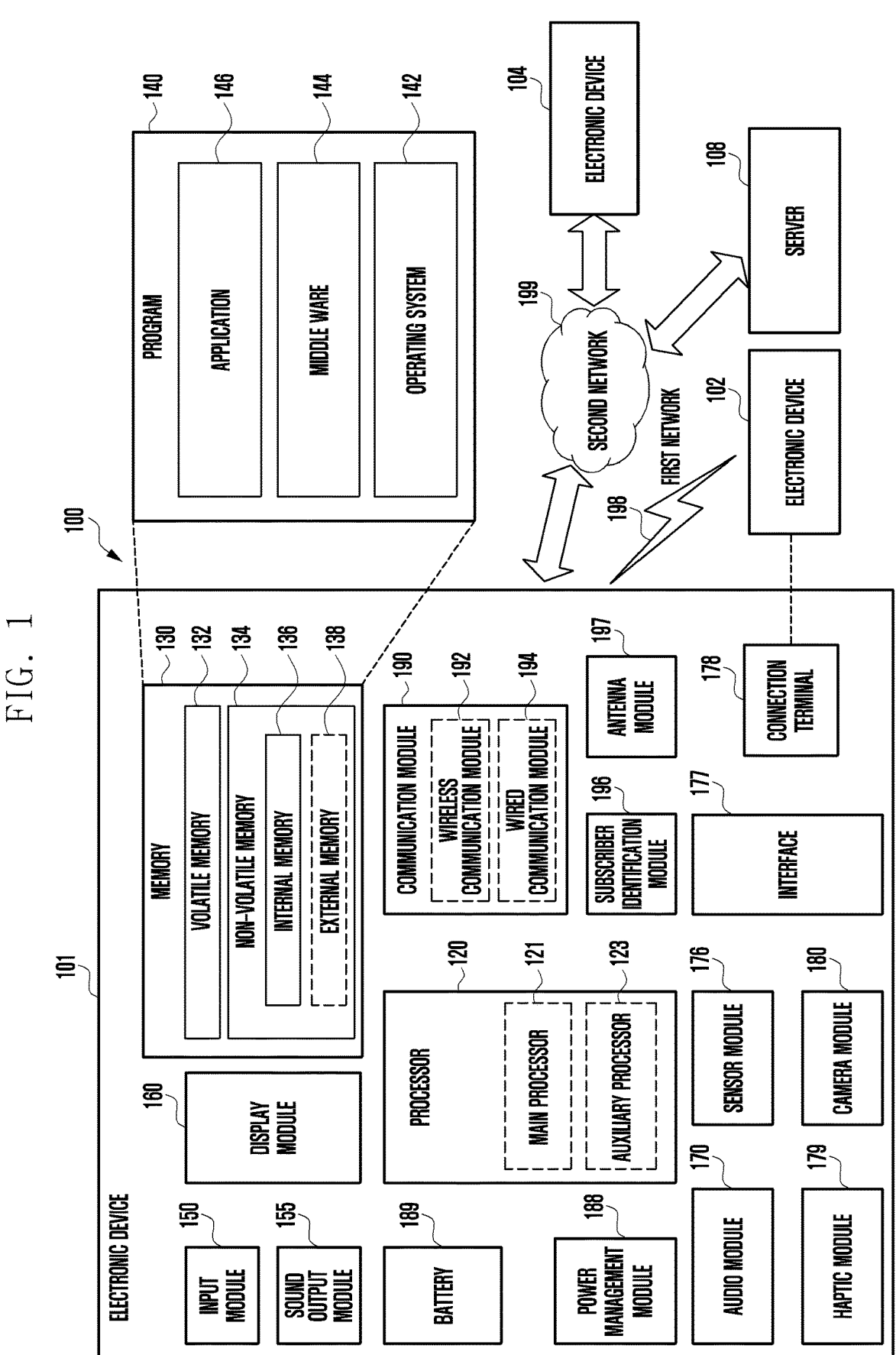
FIG. 1 is a block diagram of an electronic device in a network environment according to an embodiment of the disclosure.

FIG. 1 is a block diagram of an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or at least one of an external electronic device 104 or a server 108 via a second network 199 (e.g., a long-range wireless communication network). The electronic device 101 may communicate with the external electronic device 104 via the server 108. The electronic device 101 may include a processor 120, memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identification module (SIM) 196, and/or an antenna module 197. In some embodiments of the disclosure, at least one (e.g., the connection terminal 178) of the components may be omitted from the electronic device 101, or one or more other components may be added in the electronic device 101. In some embodiments of the disclosure, some of the components may be implemented as single integrated circuitry. For example, the sensor module 176, the camera module 180, or the antenna module 197 may be implemented as embedded in single component (e.g., the display module 160).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in a volatile memory 132, process the command or the data stored in the volatile memory 132, and store resulting data in a non-volatile memory 134. The processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., a sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123. According to an embodiment of the disclosure, the auxiliary processor 123 (e.g., a neural network processing device) may include a hardware structure specified for processing an artificial intelligence model. The artificial intelligence model may be created through machine learning. Such learning may be performed, for example, in the electronic device 101 itself on which the artificial intelligence model is performed, or may be performed through a separate server (e.g., the server 108). The learning algorithms may include, for example, supervised learning, unsupervised learning, semi-supervised learning, or reinforcement learning, but is not limited thereto. The artificial intelligence model may include a plurality of artificial neural network layers. The artificial neural network may be any of a deep neural network (DNN), a convolutional neural network (CNN), a recurrent neural network (RNN), a restricted Boltzmann machine (RBM), a deep belief network (DBN), a bidirectional recurrent DNN (BRDNN), a deep Q-network, or a combination of two or more of the above-mentioned networks, but is not limited the above-mentioned examples.

In addition to the hardware structure, the artificial intelligence model may additionally or alternatively include a software structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 and/or the non-volatile memory 134.

The program 140 may be stored in the memory 130 as software, and may include, for example, an operating system (OS) 142, middleware 144, and/or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record, and the receiver may be used for incoming calls. The receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. The display module 160 may include touch circuitry (e.g., a touch sensor) adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input module 150, or output the sound via the sound output module 155 or a headphone of an external electronic device (e.g., the external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. The interface 177 may include, for example, a high-definition multimedia interface (HDMI), a universal serial bus (USB) interface, a secure digital (SD) card interface, and/or an audio interface.

The connection terminal 178 may include a connector via which the electronic device 101 may be physically connected with the external electronic device (e.g., the external electronic device 102). The connection terminal 178 may include, for example, an HDMI connector, a USB connector, an SD card connector, and/or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. The camera module 180 may include one or more lenses, image sensors, ISPs, or flashes.

The power management module 188 may manage power supplied to or consumed by the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, and/or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more CPs that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared radiation (IR) data association (IrDA)) or the second network 199 (e.g., a long-range communication network, such as a legacy cellular network, a $5^{th}$ generation (5G) network, a next generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a $4^{th}$ generation (4G) network, and next-generation communication technology, e.g., new radio (NR) access technology. The NR access technology may support high-speed transmission of high-capacity data (i.e., enhanced mobile broadband (eMBB)), minimization of terminal power and connection of multiple terminals (massive machine type communications (mMTC)), or high reliability and low latency (ultra-reliable and low-latency communications (URLLC)). The wireless communication module 192 may support a high-frequency band (e.g., a millimeter wave (mmWave) band) to achieve, for example, a high data transmission rate. The wireless communication module 192 may support various technologies for securing performance in a high-frequency band, such as beamforming, massive multiple-input and multiple-output (MIMO), full-dimensional MIMO (FD-MIMO), array antenna, analog beamforming, or large-scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate for implementing eMBB (e.g., 20 gigabits per second (Gbps) or more), loss coverage for implementing mMTC (e.g., 164 decibels (dB) or less), or U-plane latency for realizing URLLC (e.g., 0.5 milliseconds (ms) or less for each of downlink (DL) and uplink (UL) or 1 ms or less for round trip).

The antenna module 197 may transmit or receive a signal or power to or from the outside (e.g., the external electronic device) of the electronic device 101. The antenna module 197 may include an antenna including a radiating element including a conductive material or a conductive pattern formed in or on a substrate (e.g., a printed circuit board (PCB)). The antenna module 197 may include a plurality of antennas (e.g., an antenna array). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

According to various embodiments of the disclosure, the antenna module 197 may form an mmWave antenna module. According to an embodiment of the disclosure, the mmWave antenna module may include a PCB, an RFIC that is disposed on or adjacent to a first surface (e.g., the bottom surface) of the PCB and is capable of supporting a predetermined high-frequency band (e.g., an mmWave band), and a plurality of antennas (e.g., array antennas) that is disposed on or adjacent to a second surface (e.g., the top surface or the side surface) of the PCB and is capable of transmitting or receiving a signal of the predetermined high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the external electronic devices 102 or 104 may be a device of a same type as, or a different type, from the electronic device 101. All or some of operations to be executed at the electronic device 101 may be executed at one or more of the external electronic devices (e.g., external electronic devices 102 and 104 or the server 108). For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide an ultra-low delay service using, for example, distributed computing or MEC. In another embodiment of the disclosure, the external electronic device 104 may include an internet of things (IoT) device. The server 108 may be an intelligent server using machine learning and/or neural networks. According to an embodiment of the disclosure, the external electronic device 104 or the server 108 may be included in the second network 199. The electronic device 101 may be applied to an intelligent service (e.g., smart home, smart city, smart car, or healthcare) based on 5G communication technology or IoT-related technology.

An electronic device according to an embodiment of the disclosure may be one of various types of electronic devices. The electronic devices may include a portable communication device (e.g., a smartphone), a computer device, a portable multimedia device, a portable medical device, a camera, a wearable device, or a home appliance. However, the electronic device is not limited to any of those described above.

Various embodiments of the disclosure and the terms used herein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). If an element (e.g., a first element) is referred to, with or without the term "operatively" or "communicatively," as "coupled with," "coupled to," "connected with," or "connected to" another element (e.g., a second element), the element may be coupled with the other element directly (e.g., wiredly), wirelessly, or via a third element.

The term "module" may include a unit implemented in hardware, software, or firmware, or any combination thereof, and may interchangeably be used with other terms, for example, "logic," "logic block," "part," or "circuitry." A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. The term "non-transitory" simply denotes that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAY-STORE™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2:
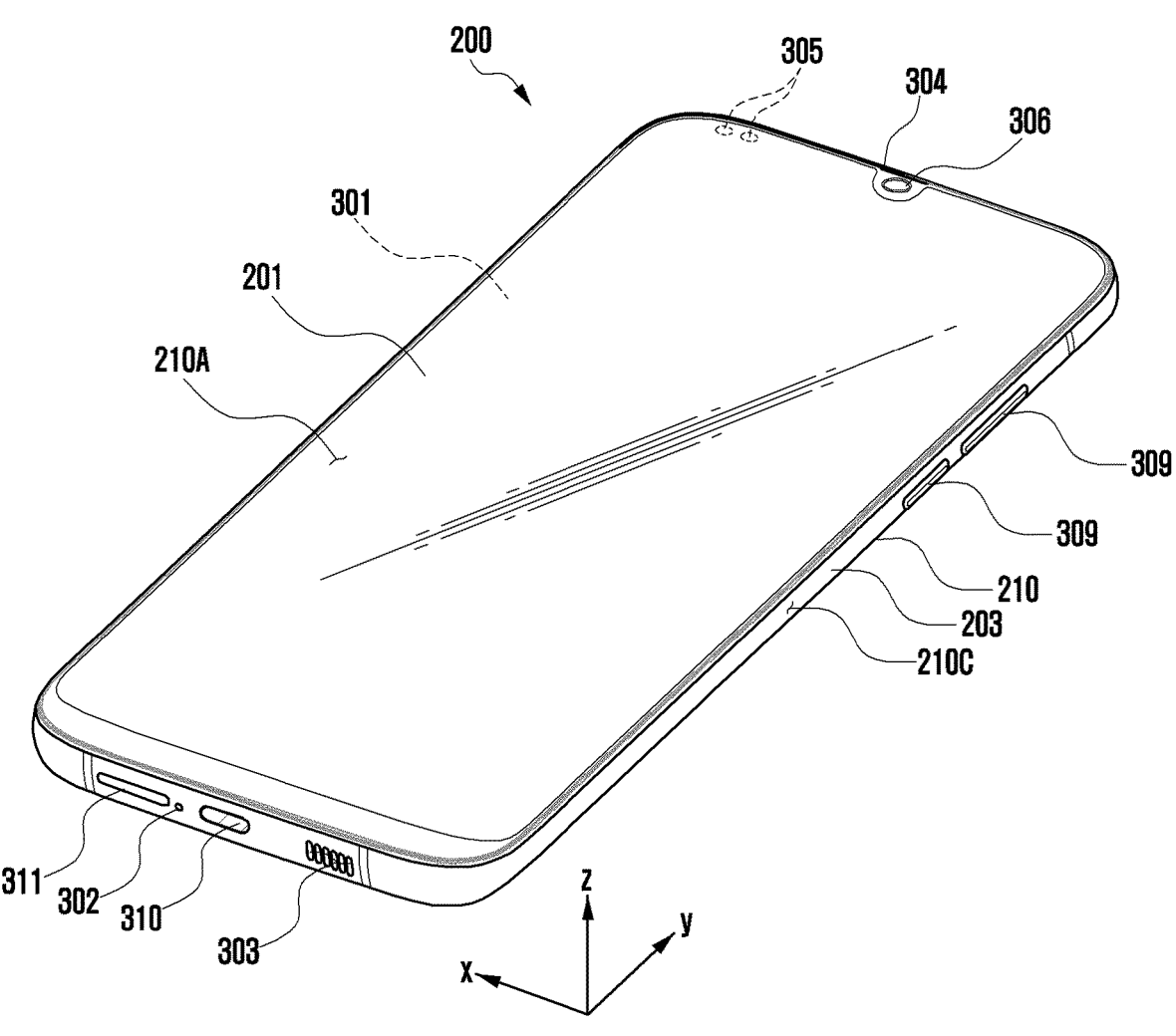
FIG. 2 is a front perspective view illustrating the electronic device according to an embodiment of the disclosure.
Figure 3:
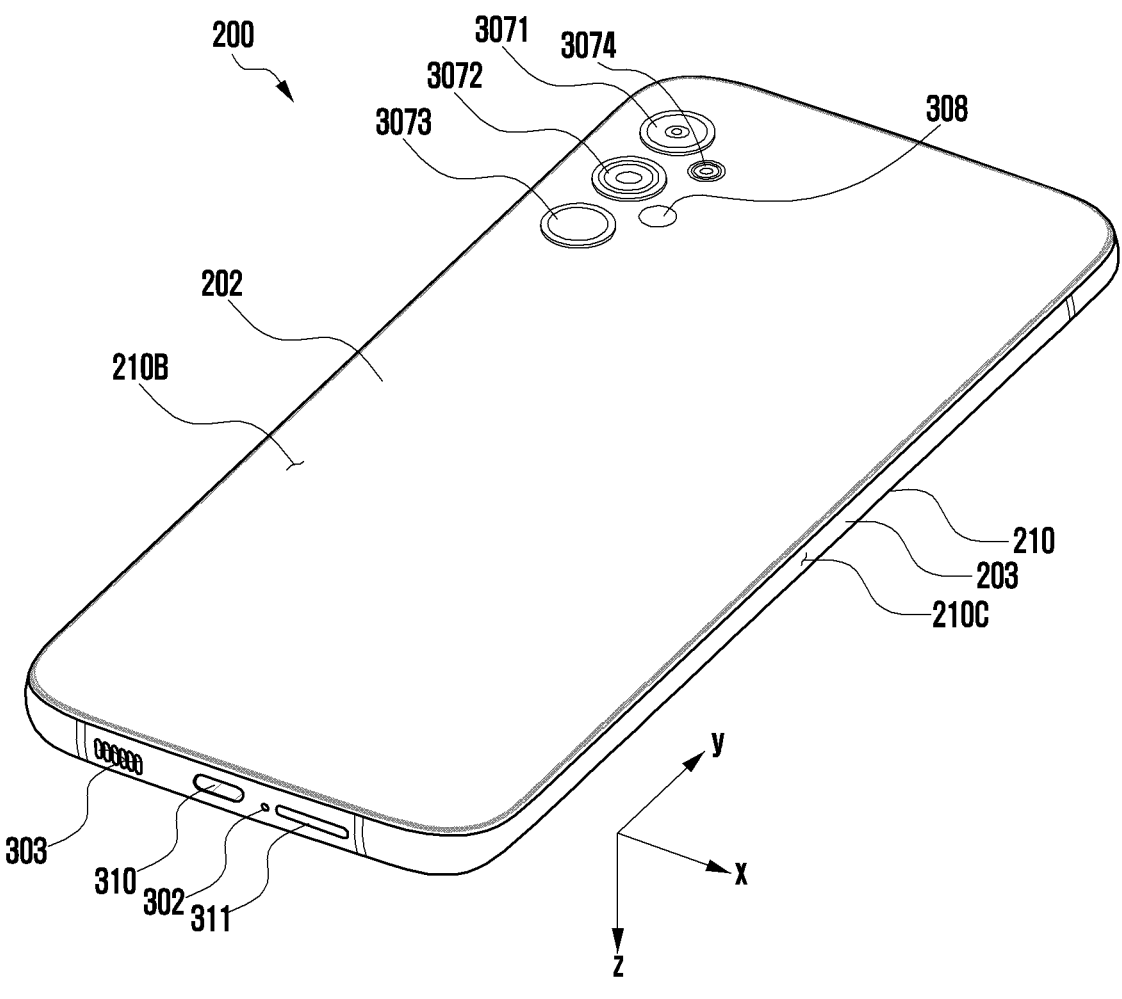
FIG. 3 is a rear perspective view illustrating the electronic device according to an embodiment of the disclosure.

FIG. 2 is a front perspective view illustrating an electronic device according to an embodiment of the disclosure. FIG. 3 is a rear perspective view illustrating an electronic device according to an embodiment of the disclosure.

In various embodiments of the disclosure, for convenience of description, a direction in which a display 301 included in electronic device 200 is visually exposed (e.g., in the direction of the +z axis) is defined as the front and an opposite direction (e.g., in the direction of the −z axis) as the rear.

Referring to FIGS. 2 and 3, an electronic device 200 (e.g., the electronic device 101 in FIG. 1) may include a housing 210. The housing 210 may provide, for example, a front surface 210A of the electronic device 200, a rear surface 210B of the electronic device 200, and a side surface 210C of the electronic device 200. In some embodiments, the housing 210 may refer to a structure including at least some of the front surface 210A, the rear surface 210B, and the side surface 210C. In an embodiment, the housing 210 may include a front surface plate (or a first plate) 201, a rear surface plate (or a second plate) 202, and a lateral member (or, a side surface bezel structure, a sidewall portion, or a side surface portion) 203. The front surface 210A of the electronic device 200 may be provided with the front surface plate 201. The front surface plate 201 may be substantially transparent at least in a portion, and may include, for example, a glass plate including various coating layers, or a polymer plate. The rear surface 210B of the electronic device 200 may be provided with the rear surface plate 202. The rear surface plate 202 may be substantially opaque and may be formed, for example, of coated or tinted glass, ceramic, polymer, metal (e.g., aluminum, stainless steel (STS), or magnesium), or a combination of at least two of the above materials. The lateral member 203 may be coupled with the front surface plate 201 and the rear surface plate 202, and may form (or provide) the side surface 210C of the electronic device 200. The lateral member 203 may include a metal and/or a polymer.

According to an embodiment, the electronic device 200 may include at least one of a display (or display module) 301, a first audio module including first audio circuitry, a second audio module including second audio circuitry, a third audio module including third audio circuitry, a sensor module 305 including a sensor or sensor circuitry, a front surface camera module 306 including a front surface camera or front surface camera circuitry, a plurality of rear surface camera modules (e.g., a first rear surface camera module 3071 including a first rear surface camera or first rear surface camera circuitry, a second rear surface camera module 3072 including a second rear surface camera or second rear surface camera circuitry, a third rear surface camera module 3073 including a third rear surface camera or third rear surface camera circuitry, and a fourth rear surface camera module 3074 including a fourth rear surface camera or fourth rear surface camera circuitry), a light emitting module 308 including a light emitter or light emitting circuitry, an input module 309 including input circuitry, a first connection terminal module 310 including a first connection terminal, and a second connection terminal module 311 including a second connection terminal. In some embodiments, the electronic device 200 may omit at least one of the above constituent elements or may additionally include other constituent elements.

A display area (e.g., a screen display area or an active area) of the display 301 may be visually exposed, for example, through the front surface plate 201. In an embodiment, the electronic device 200 may be implemented such that the display area visible through the front surface plate 201 is as large as possible (e.g., large or full screen). For example, the display 301 may be implemented to have the substantially same outline shape as the outline shape of the front surface plate 201. In an embodiment, the display 301 may include a touch sensing circuit. In some embodiments, the display 301 may include a pressure sensor that is capable of measuring an intensity (pressure) of a touch. In some embodiments, the display 301 may be coupled to or positioned adjacent to a digitizer (e.g., an electromagnetic induction panel) that detects an electric pen (e.g., a stylus pen) with a magnetic field. In some embodiments, the display 301 may be implemented to include the digitizer.

The first audio module may include a microphone positioned inside the electronic device 200, for example, corresponding to a microphone hole 302 provided in the side surface 210C of the electronic device 200. The location or number of audio modules with respect to the microphone may vary, without being limited to the examples illustrated. In another example, the electronic device 200 may include a microphone hole provided in the rear surface 210B of the electronic device 200 and a microphone positioned inside the electronic device 200 corresponding to the microphone hole. In some embodiments, the electronic device 200 may include a plurality of microphones utilized to detect a direction of sound.

The second audio module may include a first speaker positioned inside the electronic device 200, for example, corresponding to a first speaker hole 303 provided in the side surface 210C of the electronic device 200. The third audio module may include a second speaker positioned inside the electronic device 200, for example, corresponding to a second speaker hole 304 provided in the front surface 210A of the electronic device 200. In an embodiment, the second speaker may include a receiver for phone calls, and the second speaker hole may be referred to as a receiver hole. The location or number of second audio modules or third audio modules may vary, without limitation to the examples illustrated. In some embodiments, the microphone hole and the speaker hole may be implemented as a single hole. In some embodiments, the second audio module or the third audio module may include a piezo speaker with the speaker hole omitted.

The sensor module 305 may generate an electrical signal or a data value that corresponds to, for example, an internal operational state of the electronic device 200, or an external environmental state. In an embodiment, the sensor module 305 may include an optical sensor positioned inside the electronic device 200 corresponding to the front surface 210A of the electronic device 200. The optical sensor may include, for example, a proximity sensor or an illumination sensor. The optical sensor may be aligned with the opening provided in the display 301. External light may reach the optical sensor through the openings of the front surface plate 201 and the display 301. In some embodiments, the optical sensor may be positioned on a rear surface of the display 301 or below or beneath the display 301, and may perform an associated function without visually distinguishing (or exposing) the position of the optical sensor. In some embodiments, the optical sensor may be positioned in alignment with a recess provided in the rear surface of the display 301. The optical sensor may be positioned to overlap at least a portion of the screen (or the display area) and perform a sensing function without being visually exposed. In this case, some areas of the display 301 that are at least partially overlapped with the optical sensor may include different pixel structures and/or wiring structures compared to other areas. For example, some areas of the display 301 that are at least partially overlapped with the optical sensor may have a different pixel density compared to other areas. In some embodiments, some areas of the display 301 that at least partially overlap with the optical sensor may not have a plurality of pixels disposed thereon. In some embodiments, the electronic device 200 may include a biometric sensor (e.g., a fingerprint sensor) positioned on the rear surface of the display 301 or below or underneath the display 301. The biometric sensor may be implemented as an optical sensor, a capacitive sensor, or an ultrasonic sensor, and the position or number thereof may vary. The electronic device 200 may further include at least one of various other sensor modules, such as a gesture sensor, a gyro sensor, a barometric pressure sensor, a magnetic sensor, an acceleration sensor, a grip sensor, a color sensor, an infrared (IR) sensor, a temperature sensor, or a humidity sensor.

The front surface camera module 306 may be positioned inside the electronic device 200, for example, corresponding to the front surface 210A of the electronic device 200. The plurality of rear surface camera modules 3071, 3072, 3073, and 3074 may be positioned inside the electronic device 200, for example, corresponding to the rear surface 210B of the electronic device 200. The front surface camera module 306 and/or the rear surface camera modules 3071, 3072, 3073, or 3074 may include one or a plurality of lenses, an image sensor, and/or an image signal processor. The position or number of camera modules may vary without being limited to the examples illustrated.

According to an embodiment, the display 301 may include an opening aligned with the front surface camera module 306. External light may reach the front surface camera module 306 through the openings on the front surface plate 201 and the display 301. The opening of the display 301 that is aligned or overlapped with the front surface camera module 306 may be provided in the form of a notch. In some embodiments, the opening of the display 301 aligned or overlapped with the front surface camera module 306 may be provided in the form of a hole. In some embodiments, the front surface camera module 306 may be positioned on the rear surface of the display 301 or below or beneath the display 301, and may perform an associated function (e.g., taking an image) without the position of the front surface camera module 306 being visually distinguished (or exposed). The front surface camera module 306 may include, for example, a hidden display rear surface camera (e.g., an under display camera (UDC)). In some embodiments, the front surface camera module 306 may be positioned in alignment with a recess provided in the rear surface of the display 301. The front surface camera module 306 may be disposed to overlap at least a portion of the screen (or the display area) to obtain an image of an external subject without being visually exposed to the outside. In this case, some areas of the display 301 that are at least partially overlapped with the front surface camera module 306 may include different pixel structures and/or wiring structures compared to other areas. For example, some areas of the display 301 that are at least partially overlapped with the front surface camera module 306 may have a different pixel density compared to other areas. A pixel structure and/or wiring structure disposed in some areas of the display 301 that are at least partially overlapped with the front surface camera module 306 may reduce the loss of light between the outside and the front surface camera module 306. In some embodiments, some areas of the display 301 that at least partially overlap the front surface camera module 306 may not have pixels disposed thereon. In some embodiments, the electronic device 200 may further include a light emitting module (e.g., a light source) positioned inside the electronic device 200 corresponding to the front surface 210A of the electronic device 200. The light emitting module may, for example, provide status information on the electronic device 200 in the form of light. In some embodiments, the light emitting module may provide a light source that is in conjunction with an operation of the front surface camera module 306. The light emitting module may include, for example, a light-emitting diode (LED), an infrared (IR) LED, or a xenon lamp.

According to an embodiment, the rear surface plate 202 may include a plurality of openings that correspond in a one-to-one manner with the plurality of rear surface camera modules 3071, 3072, 3073, and 3074 when viewed from the top of the rear surface plate 202 (e.g., when viewed in the +z axis direction). The plurality of rear surface camera modules

3071, 3072, 3073, and 3074 may be positioned to penetrate through the plurality of openings of the rear surface plate 202. In some embodiments, the rear surface plate 202 may be implemented to include substantially transparent light transmitting areas, replacing the plurality of openings corresponding to the plurality of rear surface camera modules 3071, 3072, 3073, and 3074. In an embodiment, the plurality of rear surface camera modules 3071, 3072, 3073, and 3074 may have different features (e.g., an angle of view) or functions, and may include, for example, dual cameras or triple cameras. The plurality of rear surface camera modules 3071, 3072, 3073, and 3074 may include a plurality of camera modules including lenses that have different angles of view, and the electronic device 200 may be implemented to change the angle of view of the camera modules that is performed in the electronic device 200, on the basis of a user's selection. The plurality of rear surface camera modules 3071, 3072, 3073, and 3074 may include at least one of a wide-angle camera, a telephoto camera, a color camera, a monochrome camera, or an infrared (IR) camera (e.g., a time of flight (TOF) camera, a structured light camera). In some embodiments, the IR camera may be operated as at least a portion of the sensor module.

According to an embodiment, the rear surface plate 202 may include an opening corresponding to the light emitting module 308, when viewed from the top of the rear surface plate 202. The light emitting module 308 may be positioned to penetrate through the opening of the rear surface plate 202. In some embodiments, the rear surface plate 202 may be implemented to include substantially transparent light transmitting areas that replace the openings corresponding to the light emitting module 308. The light emitting module 308 may include a light source (e.g., flash) for the plurality of rear surface camera modules 3071, 3072, 3073, and 3074. The light emitting module 308 may include, for example, an LED or a xenon lamp.

The input module 309 may include, for example, one or more key input devices. The one or more key input devices may be positioned in openings provided in the side surface 210C of the electronic device 200, for example. In some embodiments, the electronic device 200 may not include some or all of the key input devices, and the key input devices that are not included may be implemented as soft keys using the display 301. The position or number of modules of the input module 309 may vary, and in some embodiments, the modules of the input module 309 may include at least one sensor module.

The first connection terminal module (e.g., a first connector module or a first interface terminal module) 310 may include, for example, a first connector hole provided in the side surface 210C of the electronic device 200 corresponding to a first connector (or, a first interface terminal) positioned inside the electronic device 200 and the first connector. The electronic device 200 may transmit and/or receive power and/or data with an external electronic device electrically coupled to the first connector. In an embodiment, the first connector may include a universal serial bus (USB) connector or a high definition multimedia interface (HDMI) connector. In some embodiments, the electronic device 200 may further include another connection terminal module that includes an audio connector (e.g., a headphone connector or an ear set connector). The second connection terminal module (e.g., a second connector module or a second interface terminal module) 311 may be for mounting an external storage medium (e.g., an SIM card or a memory card) to the electronic device 200. The second connection terminal module 311 may include, for example, the second connector (or the second interface terminal) positioned inside the electronic device 200, and a second connector hole provided in the side surface 210C of the electronic device 200 corresponding to the second connector. The second connection terminal module 311 may include a cover that is positioned (e.g., snap-fitted) into the second connector hole to form a portion of the side surface 210C of the electronic device 200. In an embodiment, the second connection terminal module 311 may include a tray (or an adapter) (e.g., an SIM tray) for electrically or mechanically connecting an external storage medium to the second connector. The external storage medium may be disposed in the tray and inserted into the second connector hole, and the external storage medium may be electrically coupled to the second connector. In some embodiments, the tray may be coupled to the cover. The position or number of connection terminal modules may vary without being limited to the example illustrated.

Figure 4:
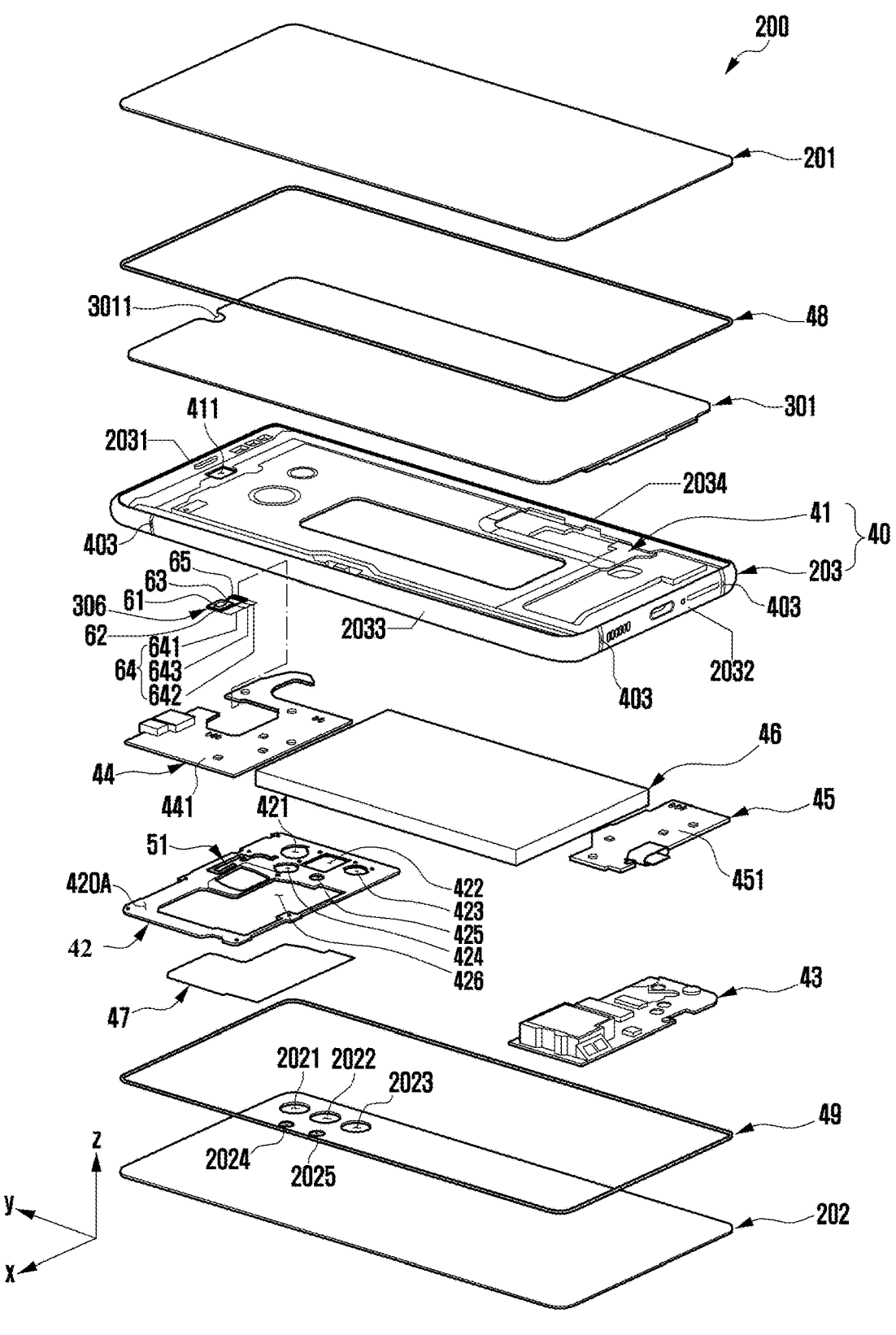
FIG. 4 is an exploded perspective view illustrating the electronic device according to an embodiment of the disclosure.
Figure 5:
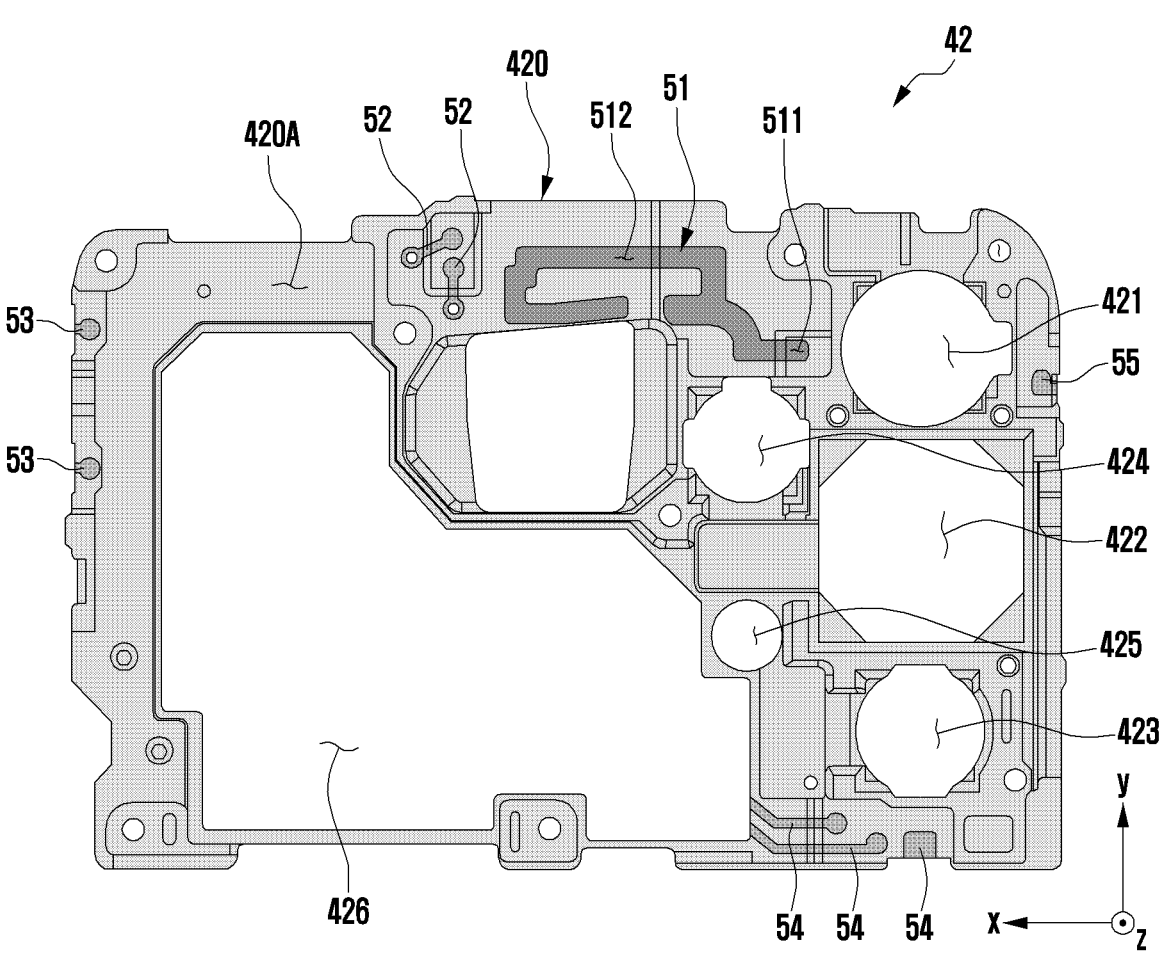
FIG. 5 is a view illustrating a second supporting member according to an embodiment of the disclosure.
Figure 6:
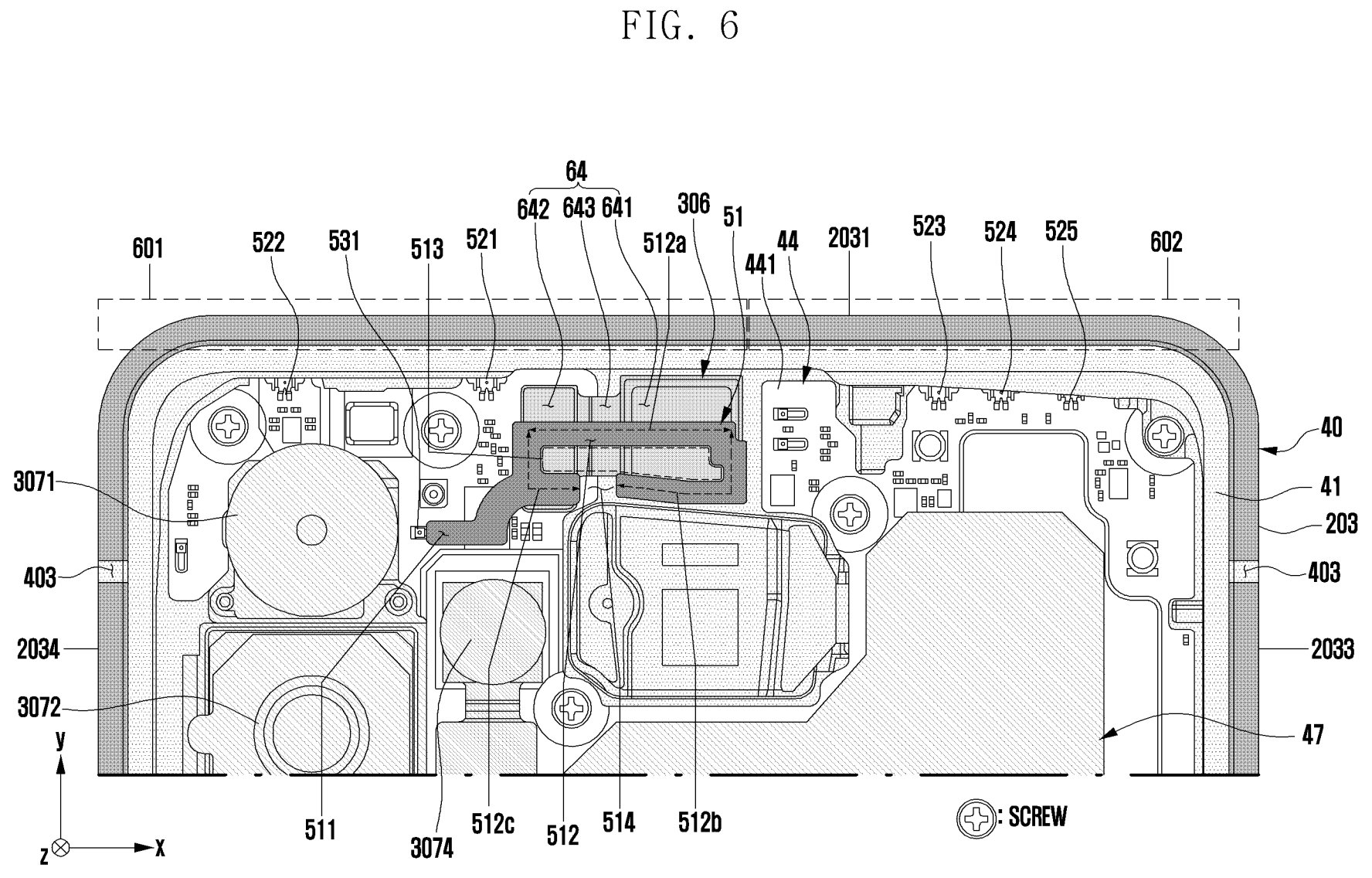
Figure 7:
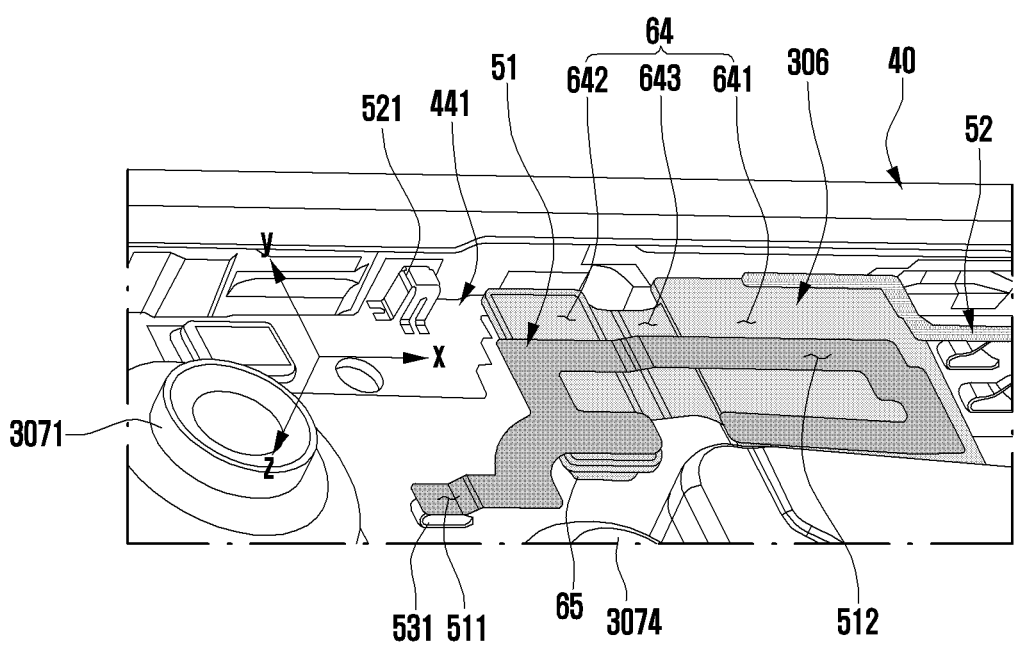
FIG. 7 is a partial perspective view illustrating the electronic device according to an embodiment of the disclosure.

FIG. 4 is an exploded perspective view illustrating an electronic device according to an embodiment of the disclosure. FIG. 5 is a view illustrating a second supporting member according to an embodiment of the disclosure. FIG. 6 is a view of a portion of an electronic device according to an embodiment of the disclosure. FIG. 7 is a partial perspective view illustrating an electronic device according to an embodiment of the disclosure.

Referring to FIGS. 4, 5, 6, and 7, in an embodiment, the electronic device 200 may include the front surface plate 201, the rear surface plate 202, the lateral member 203, a first supporting member 41, a second supporting member 42, and a third supporting member 43, the display 301, a first substrate assembly 44, a second substrate assembly 45, a battery 46, an antenna structure 47, a first adhesive member (or a first bonding member) 48, and/or a second adhesive member (or a second bonding member) 49. In some embodiments, the electronic device 200 may omit some of the above constituent elements or may additionally include other constituent elements.

According to an embodiment, the lateral member 203 may include a first side surface portion 2031 (or, a first sidewall, a first sidewall portion, a first bezel, or a first bezel portion), a second side surface portion 2032 (or, a second sidewall, a second sidewall portion, a second bezel, or a second bezel portion), a third side surface portion 2033 (or, a third sidewall, a third sidewall portion, a third bezel, or a third bezel portion), and/or a fourth side surface portion 2034 (or, a fourth sidewall, a fourth sidewall portion, a fourth bezel, or a fourth bezel portion). When viewed from the top of the front surface plate 201 (e.g., in the −z axis direction), the first side surface portion 2031 and the second side surface portion 2032 may be spaced apart from each other in a first direction (e.g., in the y axis direction) and may be substantially parallel. The first side surface portion 2031 may provide a first side surface corresponding to the +y axis direction of the electronic device 200 in the side surface 210C, and the second side surface portion 2032 may provide a second side surface corresponding to the −y axis direction of the electronic device 200 in the side surface 210C. The third side surface portion 2033 may connect one end of the first side surface portion 2031 and one end of the second side surface portion 2032. The fourth side surface portion 2034 may connect the other end of the first side surface portion 2031 and the other end of the second side surface portion 2032. When viewed from the top of the front surface plate 201, the third side surface portion 2033 and the fourth side surface portion 2034 may be spaced from each other in a second direction perpendicular to the first direction (e.g., in the x-axis direction), and may be substantially parallel. The third side surface portion 2033 may provide a third side surface corresponding to the +x axis direction of the electronic device 200 in the side surface 210C, and the fourth side surface portion 2034 may provide a fourth side surface corresponding to the −x axis direction of the electronic device 200 in the side surface 210C. A corner where the first side surface portion 2031 and the third side surface portion 2033 are connected, a corner where the first side surface portion 2031 and the fourth side surface portion 2034 are connected, a corner where the second side surface portion 2032 and the third side surface portion 2033 are connected, and/or a corner where the second side surface portion 2032 and the fourth side surface portion 2034 are connected may be implemented as a smooth curved shape.

According to an embodiment, the lateral member 203 may include a plurality of insulating portions 403, and a plurality of conductive portions separated from each other by the plurality of insulating portions 403. The side surface 210C (see FIG. 2) of the electronic device 200 may be provided by the plurality of conductive portions and the plurality of insulating portions 403. The side surface 210C may include a first area provided by the plurality of conductive portions included in the lateral member 203. The side surface 210C may include a second area provided by the plurality of insulating portions 403 included in the lateral member 203. The first area and the second area of the side surface 210C may be smoothly connected with no substantial height difference. Hereinafter, the plurality of conductive portions included in the lateral member 203 may be referred to by various terms, such as "side surface conductive structure," "side surface metal structure," "outer conductive structure," "outer metal structure," "side surface conductor," "side surface metal body," "outer conductor," or "outer metal body" of the electronic device 200.

According to an embodiment, the first supporting member 41 may be positioned inside the electronic device 200 and connected to the lateral member 203, or may be integrally formed with the lateral member 203. The first supporting member 41 may be formed, for example, of a metallic material and/or a non-metallic material (e.g., a polymer). The first supporting member 41 may include at least one conductive portion, and at least one non-conductive portion connected to the at least one conductive portion. The at least one conductive portion included in the first supporting member 41 may be connected to or integrally provided with at least a portion of the side surface conductive structure of the electronic device 200 (e.g., a metallic structure including the plurality of conductive portions of the lateral member 203). The at least one non-conductive portion included in the first supporting member 41 may be connected to or integrally provided with the plurality of insulating portions 403 included in the lateral member 203. The first supporting member 41 and the lateral member 203 may be referred to as a "front case" 40. Electronic components, such as the display 301, the first substrate assembly 44, the second substrate assembly 45, or the battery 46, or various members associated with the electronic components, may be disposed in the front case 40 or the first supporting member 41, or supported by the front case 40 or the first supporting member 41. The front case 40 or first supporting member 41 may be included in the electronic device 200 to withstand loads, which may contribute to the durability or stiffness (e.g., torsional stiffness) of the electronic device 200. In some embodiments, the front case 40 or the first supporting member 41 may be referred to by various other terms, such as "frame," "frame structure," or "framework." The first supporting member 41 is an internal structure positioned in an internal space of the electronic device 200, and in some embodiments may be referred to by various other terms, such as "bracket," "first support," or "first support structure." In some embodiments, the first supporting member 41 may be interpreted as a portion of the housing 210 (see FIG. 2).

According to an embodiment, the at least one conductive portion included in the first supporting member 41 may serve as electromagnetic shielding for the display 301, the first substrate assembly 44, the second substrate assembly 45, or various other electrical constituent elements. The at least one conductive portion included in the first supporting member 41 may be electrically connected to a first ground plane (or a first ground layer) included in a first printed circuit board 441 via a flexible conductive member (or a flexible conductor), or a conductive adhesive member (or, a conductive adhesive material or a conductive bonding material) positioned between the first supporting member 41 and the first printed circuit board 441. The at least one conductive portion included in the first supporting member 41 may be electrically connected to a second ground plane (or a second ground layer) included in the first printed circuit board 441 via a flexible conductive member (or a flexible conductor), or a conductive adhesive member (or a conductive adhesive material or a conductive bonding material) positioned between the first supporting member 41 and a second printed circuit board 451. The first ground plane and the second ground plane may be electrically connected via an electrical connection member (e.g., a flexible printed circuit board (FPCB)) electrically connecting the first printed circuit board 441 and the second printed circuit board 451. The flexible conductive member may include, for example, a conductive clip (e.g., a conductive structure including a resilient structure), a pogo-pin, a spring, a conductive poron, a conductive rubber, a conductive tape, or a conductive connector. The conductive structure including the at least one conductive portion included in the first supporting member 41, the first ground plane, and the second ground plane may be defined or interpreted as a ground (or a ground structure) of the electronic device 200.

The display 301, for example, may be positioned between the first supporting member 41 and the front surface plate 201, and may be disposed on a side of the first supporting member 41 that faces the front surface plate 201. The display 301 may be coupled to the front surface plate 201 via an optically clear adhesive member (or optically clear bonding member) such as an optical clear resin (OCA), an optical clear resin (OCR), or a super view resin (SVR). The first substrate assembly 44 and the second substrate assembly 45 may be positioned between the first supporting member 41 and the rear surface plate 202, and may be disposed on a side of the first supporting member 41 that faces the rear surface plate 202. The battery 46 may be positioned between the first supporting member 41 and the rear surface plate 202, and may be disposed on the first supporting member 41.

According to an embodiment, the first substrate assembly 44 may include the first printed circuit board 441 (e.g., a printed circuit board (PCB), or a printed circuit board assembly (PBA)). The first substrate assembly 44 may include various electronic components electrically connected to the first printed circuit board 441. The electronic components may be disposed on the first printed circuit board 441 or electrically connected to the first printed circuit board 441 via an electrical path, such as a cable or a flexible printed circuit board (FPCB). With reference to FIGS. 2 and 3, the electronic components may include, for example, a second speaker corresponding to the second speaker hole 304, the sensor module 305, the front surface camera module 306, the plurality of rear surface camera modules 3071, 3072, 3073, and 3074, the light emitting module 308, or the input module 309.

According to an embodiment, the second substrate assembly 45 may be positioned spaced apart from the first substrate assembly 44, with the battery 46 therebetween, when viewed from the top of the front surface plate 201 (e.g., when viewed in the −z axis direction). The second substrate assembly 45 may include the second printed circuit board 451 electrically connected to the first printed circuit board 441 of the first substrate assembly 44. The second substrate assembly 45 may include various electronic components electrically connected to the second printed circuit board 451. The electronic components may be disposed on the second printed circuit board 451 or electrically connected to the second printed circuit board 451 via an electrical path, such as a cable or a FPCB. With reference to FIGS. 2 and 3, the electronic components may include, for example, the microphone corresponding to the microphone hole 302, a first speaker corresponding to the first speaker hole 303, the first connector included in the first connection terminal module 310, or the second connector included in the second connection terminal module 311.

According to various embodiments, the first substrate assembly 44 or the second substrate assembly 45 may include a primary PCB (or main PCB or master PCB), a secondary PCB (or, slave PCB) disposed to partially overlap the primary PCB, and/or an interposer substrate between the primary PCB and the secondary PCB.

The battery 46 is a device for powering at least one constituent element of the electronic device 200 and may include, for example, a non-rechargeable primary cell, a rechargeable secondary cell, or a fuel cell. The battery 46 may be integrally disposed within the electronic device 200. In some embodiments, the battery 46 may be detachably attached to the electronic device 200.

According to an embodiment, the second supporting member 42 may be positioned between the first supporting member 41 and the rear surface plate 202, and may be coupled to the first supporting member 41 and/or the first substrate assembly 44 using fastening elements such as screws (or bolts). At least a portion of the first substrate assembly 44 may be positioned between the first supporting member 41 and the second supporting member 42, and the second supporting member 42 may cover and protect the first substrate assembly 44. The third supporting member 43, when viewed from the top of the rear surface plate 202 (e.g., when viewed in the +z axis direction), may be positioned at least partially spaced apart from the second supporting member 42 with the battery 46 therebetween. The third supporting member 43 may be positioned between the first supporting member 41 and the rear surface plate 202, and may be coupled to the first supporting member 41 and/or the second substrate assembly 45 using fastening elements such as screws (or bolts). At least a portion of the second substrate assembly 45 may be positioned between the first supporting member 41 and the third supporting member 43, and the third supporting member 43 may cover and protect the second substrate assembly 45. In some embodiments, the second supporting member 42 and/or the third supporting member 43 may be referred to as a "rear case." In some embodiments, the second supporting member 42 and/or the third supporting member 43 may be interpreted as a portion of the housing 210 (see FIG. 2).

According to various embodiments, any substrate assembly including the first substrate assembly 44 and the second substrate assembly 45 may be implemented. For example, when viewed from the top of the rear surface plate 202 (e.g., when viewed in the +z axis direction), the substrate assembly may include a first portion and a second portion spaced apart from each other with the battery 46 therebetween, and a third portion extending between the battery 46 and the lateral member 203 and connecting the first portion and the second portion. The third portion may be implemented in a substantially rigid manner. In some embodiments, the third portion may be implemented to be substantially flexible. In some embodiments, any supporting member may be implemented, including the second supporting member 42 and the third supporting member 43.

According to an embodiment, the antenna structure 47 may be disposed on the second supporting member 42. The antenna structure 47 may be positioned to face the rear surface plate 202. In some embodiments, the antenna structure 47 may be positioned at least partially between the battery 46 and the rear surface plate 202. The position of the antenna structure 47 may vary, including but not limited to the above. The antenna structure 47 may be implemented in the form of a film, such as an FPCB, for example. The antenna structure 47 may include at least one conductive pattern utilized as a looped radiator. The at least one conductive pattern included in the antenna structure 47 may include, for example, a plane-shaped spiral conductive pattern (e.g., a planar coil, or a pattern coil). The at least one conductive pattern included in the antenna structure 47 may be electrically connected to a communication circuit (or a wireless communication circuit) included in the first substrate assembly 44 (e.g., the wireless communication module 192 in FIG. 1). In an embodiment, the at least one conductive pattern may be utilized for short-range wireless communication, such as near field communication (NFC). In another example, the at least one conductive pattern may be utilized in magnetic secure transmission (MST) to transmit and/or receive magnetic signals. In some embodiments, the at least one conductive pattern included in the antenna structure 47 may be electrically connected to a power transmission and reception circuit included in the first substrate assembly 44. The power transmission and reception circuit may wirelessly receive power from an external electronic device or wirelessly transmit power to the external electronic device using the at least one conductive pattern. The power transmission and reception circuit may include a power management module, for example, a power management integrated circuit (PMIC), or a charger integrated circuit (IC). The power transmission and reception circuit may utilize power received wirelessly using the conductive pattern to charge the battery 46.

According to various embodiments, a processor (e.g., the processor 120 in FIG. 1) electrically coupled to the wireless communication circuit (e.g., the wireless communication module 192 in FIG. 1) may utilize the antenna structure 47 to perform a position localization function (e.g., an angle of arrival (AOA)) for a signal source (e.g., a responder, transmitter, or transmission (Tx) device). The processor may perform both angle-of-attack (AOA), which measures angle, and ranging, which measures distance. In an embodiment, the processor may identify (or estimate) a distance between the electronic device 200 and the signal source using at least one antenna element (e.g., the first antenna element, the second antenna element, and/or the third antenna element) included in the antenna structure 47. In an embodiment, the processor may identify or estimate an angle of reception (e.g., a direction of a signal) of a signal with respect to a configured axis of the electronic device 200 using at least one of a difference in arrival time of a response message to a request message via the at least two antenna elements included in the antenna structure 47, a difference in a reach distance between the received signals, or a phase difference. The electronic device 200 may utilize a bandwidth of broadband (e.g., ultra-wide band (UWB)) to support the position localization function. The UWB may refer, for example, to a technology that follows the international standard of IEEE 802.15.4 to communicate over the bandwidth of broadband. In an embodiment, the processor may identify or estimate a position of the signal source (e.g., a responder, a transmitter, or a transmission (Tx) device) with respect to the electronic device 200 (e.g., an initiator, a receiver, or an Rx device) using a phase difference in the signals received through the plurality of antenna elements included in the antenna structure 47. The antenna structure 47 may be implemented as a printed circuit board (e.g., a flexible printed circuit board (FPCB)) and may be, for example, a patch antenna including a plurality of patches (e.g., the first antenna element, the second antenna element, and the third antenna element).

According to an embodiment, the first adhesive member 48 may be positioned between the front surface plate 201 and the first supporting member 41, or between the front surface plate 201 and the lateral member 203. The front surface plate 201 may be coupled to the first supporting member 41 or the lateral member 203 through the first adhesive member 48. The first adhesive member 48 may be disposed in the shape of an annulus, for example, adjacent an edge (or a rim) of the front surface plate 201. The first adhesive member 48 may be disposed in various other shapes that are not limited to the examples illustrated. In some embodiments, the first adhesive member 48 may include a plurality of adhesive members separated from each other. In this case, there may be a separate adhesive member or fill member that connects the two separate adhesive members.

According to an embodiment, the second adhesive member 49 may be positioned between the rear surface plate 202 and the first supporting member 41, or between the rear surface plate 202 and the lateral member 203. The rear surface plate 202 may be coupled to the first supporting member 41 or the lateral member 203 through the second adhesive member 49. The second adhesive member 49 may be disposed in the shape of an annulus, for example, adjacent an edge (or a rim) of the rear surface plate 202. The second adhesive member 49 may be disposed in various other shapes that are not limited to the examples illustrated. In some embodiments, the second adhesive member 49 may include a plurality of adhesive members separated from each other. In this case, there may be a separate adhesive member or fill member that connects the two separate adhesive members. The first adhesive member 48 or the second adhesive member 49 may include, for example, a thermo-responsive adhesive material, a photoresponsive adhesive material, a conventional adhesive, or a double-sided tape.

According to an embodiment, at least a portion of the side surface conductive structure (e.g., a metal structure including the plurality of conductive portions of the lateral member 203) included in the electronic device 200 may be electrically connected to a communication circuit (e.g., the wireless communication module 192 in FIG. 1) included in the first substrate assembly 44 or the second substrate assembly 45 to serve as an antenna radiator. When the wireless communication circuit provides (or feeds) an electromagnetic signal (or an RF signal or radiated current) to the antenna radiator via a transmission line, the electromagnetic signal provided (or feed) from the wireless communication circuit may be transmitted (or radiated) to the outside of the electronic device 200 via the antenna radiator. The antenna radiator may receive the electromagnetic signal from the outside of the electronic device 200, and the received electromagnetic signal may be transmitted to the wireless communication circuit via the transmission line. The transmission line may be an electrical path through which signals (voltage and current) of radio frequency (RF) are transmitted between the antenna radiator and the communication circuit. The wireless communication circuit may process a transmitted signal or a received signal in at least one selected or designated frequency band via the at least one antenna radiator. The selected or designated frequency band may include at least one of, for example, a low band (LB) (e.g., about 600 megahertz (MHz) to about 1 gigahertz (GHz)), a middle band (MB) (e.g., about 1 GHz to about 2.3 GHz), a high band (HB) (e.g., about 2.3 GHz to about 2.7 GHz), or an ultra-high band (UHB) (e.g., about 2.7 GHz to about 6 GHz). The designated frequency band may include a variety of other frequency bands.

According to an embodiment, the side surface conductive structure of the electronic device 200 may be electrically connected with a plurality of flexible conductive members (or flexible conductors) 521, 522, 523, 524, and 525 disposed on the first printed circuit board 441. The plurality of flexible conductive members 521, 522, 523, 524, or 525 may be a conductive clip, but may not be limited thereto, and may be provided as a pogo pin, a spring, a conductive poron, a conductive rubber, a conductive tape, or a conductive connector. Any one of the plurality of flexible conductive members 521, 522, 523, 524, and 525 may be electrically connected with the wireless communication circuit disposed on the first printed circuit board 441 (e.g., the wireless communication module 192 in FIG. 1). A portion of the side surface conductive structure that is electrically connected to the wireless communication circuit may be a feed point (or feed portion). Any other of the plurality of flexible conductive members 521, 522, 523, 524, and 525 may be electrically connected to the first ground plane (or the ground of the electronic device 200) included in the first printed circuit board 441. A portion of the side surface conductive structure that is electrically connected to the first ground plane may be a grounding point (or a grounding portion). When the wireless communication circuit provides a radiated current (or, an electromagnetic signal or RF signal) to the feed point, at least a portion of the side surface conductive structure may provide a signal path between the feed point and the ground point. The at least a portion of the side surface conductive structure may provide an electrical path corresponding to a signal path (e.g., a length represented by a ratio of wavelengths) to operate as an antenna radiator having a resonant frequency corresponding to the electrical path. The position of the feed point or ground point or the positions of the plurality of insulating portions 403 with respect to the side surface conductive structure may not be limited to the example illustrated and vary. A conductive portion of the side surface conductive structure that serves as the antenna radiator may vary depending on the position or number of the feed points, ground points, or insulators.

According to an embodiment, the side surface conductive structure may include a first conductive portion 601 and a second conductive portion 602 utilized as an antenna radiator. The first conductive portion 601 and the second conductive portion 602 may be included in the first side surface portion 2031. The front surface camera module 306 may be positioned close to the first side surface portion 2031 among the first side surface portion 2031, the second side surface portion 2032, the third side surface portion 2033, and the fourth side surface portion 2034 when viewed from the top of the rear surface 210B of the electronic device 200 (see FIG. 3).

According to an embodiment, the front surface camera module 306 may include an image sensor portion (or a camera portion) 61 and a third printed circuit board 62. The image sensor portion 61 may be disposed on the third printed circuit board 62. The image sensor portion 61 may convert light into electrical signals (or digital signals). The image sensor portion 61 may include, for example, an image sensor, such as a charge coupled device (CCD), and various control circuits related to the image sensor. The first supporting member 41 may include an opening 411 provided corresponding to the image sensor portion 61. The front surface camera module 306 may be disposed on the first supporting member 41 in alignment with the opening 411 included in the first supporting member 41. The front surface camera module 306 may be inserted at least partially into the opening 411 of the first supporting member 41. The image sensor portion 61 may include a light receiving area that faces the front surface plate 201. The image sensor portion 61 may detect external light through the light receiving area and generate an electrical signal. The light receiving area of the image sensor portion 61 may refer, for example, to a point or focal plane at which a focus is formed for light reflected from an external object. The display 301 may include an opening 3011 in alignment with the opening 411 of the front surface camera module 306 or the first supporting member 41. The opening 3011 of the display 301 may be in the shape of a notch, as in the example illustrated, but not limited thereto, and may also be provided in the shape of a hole. External light may reach the image sensor portion 61 of the front surface camera module 306 through the opening 3011 of the front surface plate 201 and the display 301. In some embodiments, the opening 3011 of the display 301 may be omitted, and the front surface camera module 306 may be positioned on the rear surface of the display 301 or beneath the display 301. The front surface camera module 306 may be, for example, a hidden display rear surface camera (e.g., UDC). In some embodiments, the front surface camera module 306 may be positioned in alignment with a recess provided in the rear surface of the display 301.

According to an embodiment, the third printed circuit board 62 of the front surface camera module 306 may be electrically connected to the first printed circuit board 441 via a flexible printed circuit board 63. A connector 65 may be disposed on the flexible printed circuit board 63 and may be electrically connected to the first printed circuit board 441. The first printed circuit board 441 may include a connector (not illustrated) for the camera module disposed on one side of the first printed circuit board 441 facing the rear surface plate 202, and the connector 65 may be electrically connected to the connector for the camera module. In some embodiments, the flexible printed circuit board 63 and connector 65 may be defined or interpreted as a portion of the front surface camera module 306. In some embodiments, any flexible printed circuit board (or rigid-flexible printed circuit board (RF PCB)) (hereinafter, referred to as a "camera module substrate" 64) may be provided in replacement of the third printed circuit board 62 and the flexible printed circuit board 63. The camera module substrate 64 may include a first area 641 on which the image sensor portion 61 is disposed, a second area 642 on which the connector 65 is disposed, and a third area 643 which connects the first area 641 and the second area 642. An electrical signal generated by the image sensor portion 61 may be provided via the third area 643 to a processor disposed on the first printed circuit board 441 (e.g., the processor 120 in FIG. 1, an application processor (AP), a graphics processing device, or an image signal processor).

According to various embodiments, the front surface camera module 306 may further include a lens assembly and/or an actuator. The lens assembly may include a body tube structure (or, a body tube portion or camera housing) including a light shielding material, and one or more lenses positioned on the body tube structure. The light receiving area of the image sensor portion 61 may be aligned overlapping with one or more lenses when viewed from the top of the front surface plate 201 (e.g., when viewed in the −z axis direction). External light passing through the front surface plate 201 may pass through one or more lenses to reach the light receiving area of the image sensor portion 61. The one or more lenses may collect or disperse light reflected from external objects (or subjects) to allow an optical image to fall onto the light receiving area of the image sensor portion 61. In some embodiments, the front surface camera module 306 may further include an aperture positioned between any two lenses, or between the lens and the image sensor. The actuator may support, for example, an auto focus function for shooting with precise focus. The AF function may provide a shooting with an out of focus effect. The position of the lens may be adjusted using the actuator (or AF actuator), allowing the lens to focus automatically. For example, the actuator may be used to identify an optimal focal length (e.g., a distance between one or more lenses and a focal plane) depending on a subject distance. The angle of view may vary depending on the focal length. For example, the actuator may apply a current to a coil to adjust the position of the lens by electromagnetic forces between the coil and a magnet. In an embodiment, the actuator may be implemented in the encoder method or piezo method. Using the encoder method or piezo method, the position of the lens may be identified by a position sensor and controlled. In some embodiments, the AF actuator may be implemented on the basis of the voice coil motor method. The voice coil motor method allows the position of the lens to be controlled by a current applied to the coil. In some embodiments, the front surface camera module 306 may not provide the AF function, in which case the actuator may be omitted. In case that the front surface camera module 306 does not provide the AF function and actuator, the angle of view of the front surface camera module 306 may be configured to be a wide angle, and the front surface camera module 306 may be capable of shooting with infinite focus without the AF function. The front surface camera module 306 may omit some of the aforementioned constituent elements or may additionally include other constituent elements. For example, the front surface camera module 306 may further include a filter to reduce an image noise. The first rear surface camera module 3071, second rear surface camera module 3072, third rear surface camera module 3073, or fourth rear surface camera module 3074 in FIG. 3 may be provided in the form that is substantially identical to or at least partially similar to the front surface camera module 306.

According to an embodiment, the second supporting member 42 may include a first opening 421, a second opening 422, a third opening 423, a fourth opening 424, a fifth opening 425, and/or a sixth opening 426. The first rear surface camera module 3071, second rear surface camera module 3072, third rear surface camera module 3073, and light emitting module 308 in FIG. 3 may be disposed on the first supporting member 41 between the first supporting member 41 and the rear surface plate 202. The first rear surface camera module 3071 may be positioned in an opening 2021 of the rear surface plate 202 through the first opening 421 of the second supporting member 42. The second rear surface camera module 3072 may be positioned in an opening 2022 of the rear surface plate 202 through the second opening 422 of the second supporting member 42. The third rear surface camera module 3073 may be positioned in an opening 2023 of the rear surface plate 202 through the third opening 423 of the second supporting member 42. The fourth rear surface camera module 3074 may be positioned in an opening 2024 of the rear surface plate 202 through the fourth opening 424 of the second supporting member 42. The light emitting module 308 may be positioned in an opening 2025 of the rear surface plate 202 through the fifth opening 425 of the second supporting member 42. In some embodiments, a transmitting area that provides a portion of the rear surface 210B (see FIG. 3) of the electronic device 200 may be implemented in replacement of the openings 2021, 2022, 2023, 2024, or 2025 of the rear surface plate 202. The antenna structure 47 may be disposed on the second supporting member 42 corresponding to the sixth opening 426 of the second supporting member 42. When viewed from the top of the rear surface 210B of the electronic device 200 (see FIG. 3), a rim area of the antenna structure 47 may be disposed in an area adjacent to the sixth opening 426 of the second supporting member 42, and the antenna structure 47 may be overlapped with the sixth opening 426. In some embodiments, the second supporting member 42 may be implemented to include a recess for stably positioning the antenna structure 47 in replacement of the sixth opening 426. The antenna structure 47 may include an electromagnetic shielding member (or electromagnetic shielding sheet) (e.g., a graphite sheet) providing a rear surface thereof (e.g., a side facing the front surface plate of the antenna structure 47). The electromagnetic shielding member may reduce degradation of the antenna radiation performance of the antenna structure 47 when the antenna structure 47 transmits or receives signals passing through the rear surface plate 202. The second supporting member 42 may include a plurality of screw holes for receiving screws.

According to an embodiment, the second supporting member 42 may include a non-conductive support (or non-conductive member, non-conductive supporting member, non-conductive structure, or second support) 420 that includes a non-metallic material (e.g., a polymer) and a plurality of conductive patterns 51, 52, 53, 54, and 55 disposed on the non-conductive support 420. First conductive pattern 51, second conductive pattern 52, third conductive pattern 53, fourth conductive pattern 54, or fifth conductive pattern 55 may be implemented, for example, in a laser direct structuring (LDS). The LDS may be a method of drawing (or designing) a pattern on the non-conductive support 420 using a laser and plating a conductive material, such as copper or nickel, on top of the pattern to form a conductive pattern. In some embodiments, the first conductive pattern 51, second conductive pattern 52, third conductive pattern 53, fourth conductive pattern 54, or fifth conductive pattern 55 may be implemented as separate metal plates or separate flexible printed circuit boards and disposed on the non-conductive support 420. The plurality of conductive patterns 51, 52, 53, 54, and 55 may be electrically connected to the first printed circuit board 441. In one embodiment, the first conductive pattern 51, second conductive pattern 52, third conductive pattern 53, fourth conductive pattern 54, or fifth conductive pattern 55 may be electrically connected to the first printed circuit board 441 via a flexible conductive member (e.g., a conductive clip, pogo pin, spring, conductive poron, conductive rubber, conductive tape, or conductive connector) or a conductive adhesive member (or conductive adhesive material) positioned between the second supporting member 42 and the first printed circuit board 441.

According to an embodiment, the second conductive pattern 52, third conductive pattern 53, fourth conductive pattern 54, or fifth conductive pattern 55 may be electrically connected with the wireless communication circuit disposed on the first printed circuit board 441 (e.g., the wireless communication module 192 in FIG. 1) to serve as an antenna radiator. The wireless communication circuit may transmit or receive signals in the selected or designated frequency band (e.g., LB, MB, HB, UHB, or any other frequency band) via the antenna radiator. The feed portion to which the electromagnetic signal (or, RF signal or radiated current) is provided from the wireless communication circuit of the second conductive pattern 52, third conductive pattern 53, fourth conductive pattern 54, or fifth conductive pattern 55 may be positioned between the non-conductive support 420 of the second supporting member 42 and the first printed circuit board 441. The feed portion may be electrically connected to the wireless communication circuit disposed on the first printed circuit board 441 via a flexible conductive member between the feed portion and the first printed circuit board 441. The second conductive pattern 52, third conductive pattern 53, fourth conductive pattern 54, or fifth conductive pattern 55 may include a radiating portion extending from the feed portion. The radiating portion is a portion of the antenna radiator that substantially radiates electromagnetic signals (or RF signals) to the outside or substantially receives electromagnetic signals from the outside, and may be positioned substantially between the non-conductive support 420 of the second supporting member 42 and the rear surface plate 202. The antenna radiator (e.g., the second conductive pattern 52, third conductive pattern 53, fourth conductive pattern 54, or fifth conductive pattern 55) may be electrically connected to the first ground plane (or the ground of the electronic device 200) included on the first printed circuit board 441. The ground of the electronic device 200 may be an antenna ground (or antenna ground area). The antenna ground may contribute to obtaining antenna radiation performance, obtaining coverage, and/or reducing electro-magnetic interference (EMI) (or signal loss) with respect to at least one antenna radiator included in the electronic device 200. The position, shape, or number of antenna radiators included in the second supporting member 42 may vary without being limited to the examples illustrated.

According to an embodiment, the first conductive pattern 51 may be electrically connected to the first ground plane (or the ground of the electronic device 200) included in the first printed circuit board 441. The first conductive pattern 51 may be overlapped with the front surface camera module 306 when viewed from the top (e.g., when viewed in the +z axis direction) of the rear surface 210B of the electronic device 200 (see FIG. 3). The first conductive pattern 51 may include a first portion (or, a first area or first conductive area) 511 electrically connected to the first printed circuit board 441 via a flexible conductive member (or a flexible conductor) 531 or a conductive adhesive member (or conductive adhesive material). The flexible conductive member 531 may be a conductive clip, but may not be limited thereto, and may be provided as a pogo pin, a spring, a conductive poron, a conductive rubber, a conductive tape, or a conductive connector. The first conductive pattern 51 may include a second portion 512 (or, a second area or second conductive area) extending from the first portion 511. The second portion 512 may be overlapped with the front surface camera module 306 when viewed from the top of the rear surface 210B of the electronic device 200. The non-conductive support 420 of the second supporting member 42 may include a first surface 420A facing the front surface plate 201 and a second surface (not illustrated) facing the rear surface plate 202. The first conductive pattern 51 may be disposed on the first surface 420A of the non-conductive support 420. In some embodiments, at least a portion of the second portion 512 included in the first conductive pattern 51 may be disposed on the second surface of the non-conductive support 420. In some embodiments, at least a portion of the second portion 512 included in the first conductive pattern 51 may be positioned inside the non-conductive support 420 of the second supporting member 42.

According to an embodiment, the first conductive pattern 51 electrically connected to the first ground plane of the first printed circuit board 441 (or the ground of the electronic device 200) may reduce or prevent electromagnetic interference (e.g., electromagnetic interference or electromagnetic noise) that the antenna radiator (e.g., the first conductive portion 601 or second conductive portion 602) around the front surface camera module 306 has on the front surface camera module 306. In an embodiment, the first conductive pattern 51 electrically connected to the ground of the electronic device 200 may be operated as an absorber (e.g., an electromagnetic wave absorber, noise absorber, or EMI absorber). Electromagnetic interference (e.g., electromagnetic noise or noise fields) of electromagnetic waves radiated from the antenna radiator on the front surface camera module 306 may flow through the first conductive pattern 51 to the ground of the electronic device 200 and be absorbed by the ground of the electronic device 200. The first conductive pattern 51 may reduce the electromagnetic interference of the antenna radiator on the front surface camera module 306, thereby reducing or preventing degradation or malfunction of the front surface camera module 306.

According to an embodiment, when the wireless communication circuit (e.g., the wireless communication module 192 in FIG. 1) provides (or feeds) electromagnetic signals (or, RF signals or radiated current) to the antenna radiator (e.g., the first conductive portion 601 or second conductive portion 602), the antenna radiator may radiate (or transmit) electromagnetic waves (e.g., Tx signals) traveling in a plurality of directions. The first conductive pattern 51 electrically connected to the ground of the electronic device 200 may reduce or prevent some electromagnetic waves, which travel toward the front surface camera module 306 among electromagnetic waves radiated from the antenna radiator, from being transmitted to the front surface camera module 306 or being excited. Some of the electromagnetic waves radiated from the antenna radiator and traveling toward the front surface camera module 306 may flow through the first conductive pattern 51 to the ground of the electronic device 200 and be absorbed by the ground of the electronic device 200.

According to an embodiment, the first conductive pattern 51 may be provided to resonate substantially at a frequency or frequency band corresponding to some electromagnetic waves, which travels toward the front surface camera module 306, among the electromagnetic waves radiated from the antenna radiator (e.g., the first conductive portion 601 or the second conductive portion 602) (e.g., a selected or designated frequency band, an operating frequency band and an in-use frequency band in which the antenna radiator is intended to transmit or receive the electromagnetic waves). Therefore, the first conductive pattern 51 may better operate as an absorber that is capable of absorbing, transmitting, or receiving some electromagnetic waves, which travels toward the front surface camera module 306, among the electromagnetic waves radiated from the antenna radiator. The first conductive pattern 51 may have more enhanced characteristics for electromagnetic wave such that a reception performance (or an absorption performance) for an electromagnetic noise that may affect the front surface camera module 306 is greater than a transmission performance (or a radiation performance) for re-radiating the received (or absorbed) electromagnetic noise into a space around the first conductive pattern 51. The first conductive pattern 51 may have electromagnetic properties that may reduce degradation of antenna radiation performance or radio wave transmission and reception performance of the antenna radiator (e.g., the first conductive portion 601 or the second conductive portion 602) in the vicinity of the front surface camera module 306.

According to an embodiment, the first conductive pattern 51 may be positioned to be spaced apart from the antenna radiator (e.g., the first conductive portion 601 or second conductive portion 602) in the vicinity of the front surface camera module 306 to have an electromagnetically designated degree of isolation with respect to the antenna radiator. The presence of a designated degree of isolation between the first conductive pattern 51 and the antenna radiator in the vicinity of the front surface camera module 306 may be defined or interpreted such that, with respect to a selected or designated frequency band (or, an operating frequency band or in-use frequency band), the first conductive pattern 51 does not substantially affect the antenna radiation performance or radio wave transmission and reception performance for the antenna radiator (e.g., the first conductive portion 601 or second conductive portion 602) in the vicinity of the front surface camera module 306.

The first conductive pattern 51 may have at least one mode corresponding to a natural frequency according to properties of the first conductive pattern 51, such as, for example, a shape, material, or density. A mode (or a natural mode or natural resonance mode) may be defined or interpreted as the form in which energy is concentrated in some structure. The direction of the electric and magnetic fields, and the form in which the energy is radiated, may vary depending on the mode. The first conductive pattern 51 may provide a radiation pattern (or beam pattern) capable of receiving an electromagnetic noise, and the radiation pattern of the first conductive pattern 51 may be determined on the basis of the mode. In an embodiment, the first conductive pattern 51 may provide a radiation pattern capable of receiving (or absorbing) some of the electromagnetic waves, which travel toward the front surface camera module 306, among the electromagnetic waves radiated from the antenna radiator (e.g., the first conductive portion 601 or second conductive portion 602). In one embodiment, the first conductive pattern 51 may provide a radiation pattern that has no substantial effect on some of the electromagnetic waves, which travel in a direction other than toward the front surface camera module 306, among the electromagnetic waves radiated from the antenna radiator. Since the first conductive pattern 51 provides a radiation pattern that is capable of receiving (or absorbing) only some of the electromagnetic waves, which travel toward the front surface camera module 306, among the electromagnetic waves radiated from the antenna radiator, the antenna radiation performance or radio wave transmission and reception performance with respect to the antenna radiator is secured, thereby reducing the electromagnetic effects of the antenna radiator on the front surface camera module 306.

According to an embodiment, the antenna radiator (e.g., the first conductive portion 601 or second conductive portion 602) in the vicinity of the front surface camera module 306 may form a beam pattern for (or corresponding to) coverage (or beam coverage). The beam pattern for coverage may include an effective area over which the antenna radiator is capable of transmitting (or radiating) or receiving (or detecting) electromagnetic waves (or radio waves). The effective area of the beam pattern may include a main beam (or a main lobe) capable of focusing electromagnetic wave energy (or wave energy) in at least one designated direction and/or transmitting or receiving electromagnetic signals. The main beam refers to a beam that radiates relatively high amounts of energy in the direction of maximum radiation (boresight), and the antenna radiator may transmit and/or receive frequency signals substantially over the main beam. In an embodiment, the first conductive pattern 51 may be positioned to be spaced apart from the antenna radiator so as to have no substantial electromagnetic effects on the main beam, and thereby the antenna radiation performance (or radio wave transmission and reception performance) of the antenna radiator may not be substantially affected by the first conductive pattern 51. The beam pattern may include side beams (or side lobes) in directions other than the main beam. In an embodiment, the first conductive pattern 51 may reduce some of the electromagnetic waves (or electromagnetic wave energy) radiated from the antenna radiator, such as a side beam, from being transmitted to (or excited to) the front surface camera module 306. The side beams may flow through the first conductive pattern 51 to the ground of the electronic device 200 and be absorbed by the ground of the electronic device 200, thereby degradation of the performance of the front surface camera module 306 or malfunction of the front surface camera module 306 due to the antenna radiator may be reduced or prevented.

According to an embodiment, the first conductive pattern 51 electrically connected to the ground of the electronic device 200 may reduce or prevent the electromagnetic effects of noise that may be generated by the front surface camera module 306 from affecting the antenna radiator (e.g., the first conductive portion 601 or second conductive portion 602) in the vicinity of the front surface camera module 306. When the front surface camera module 306 is operated, the noise (e.g., harmonic) may be generated by the front surface camera module 306. The noise generated by the front surface camera module 306 may flow through the first conductive pattern 51 to the ground of the electronic device 200 and be absorbed by the ground of the electronic device 200. When the front surface camera module 306 is in operation, the first conductive pattern 51 reduces or prevents the noise generated by the front surface camera module 306 from radiating into a space in the vicinity of the front surface camera module 306. Thereby, it is possible to reduce or prevent degradation of antenna radiation performance, radio wave transmission and reception performance, or signal reception sensitivity with respect to the antenna radiator by the front surface camera module 306.

According to an embodiment, the first conductive pattern 51 may be provided to resonate at a frequency or frequency band corresponding to the noise (or EMI of a specific frequency) (e.g., harmonic) generated by the front surface camera module 306. Therefore, the first conductive pattern 51 may better operate as an absorber that may absorb, transmit, or receive the noise generated by the front surface camera module 306. The first conductive pattern 51 may have more enhanced characteristics for electromagnetic wave such that a reception performance (or an absorption performance) for the noise generated by the front surface camera module 306 is greater than a transmission performance (or a radiation performance) for re-radiating the received (or absorbed) electromagnetic noise into a space around the first conductive pattern 51.

According to an embodiment, the first conductive pattern 51 may have a resonant length or electrical length (e.g., a length represented by a ratio of wavelengths) corresponding to a frequency or frequency band corresponding to the noise generated by the front surface camera module 306. Therefore, when the noise generated by the front surface camera module 306 is radiated, the noise has an effect (e.g., strength of the electromagnetic field) on a space in the vicinity of the front surface camera module 306. In this case, the first conductive pattern 51 may better operate as an absorber that may receive the noise generated by the front surface camera module 306 to reduce the noise effect.

According to an embodiment, the second portion 512 of the first conductive pattern 51 may include a portion extending from the first area 641 of the camera module substrate 64 to the second area 642 of the camera module substrate 64 across the third area 643 of the camera module substrate 64 when viewed from the top of the rear surface 210B of the electronic device 200 (e.g., when viewed in the +z axis direction). A plurality of signal lines (or electrical paths) transmitting electrical signals generated by the image sensor portion 61 from the first area 641 to the second area 642 may extend from the first area 641 to the second area 642 across the third area 643. A control signal provided by the processor (e.g., the processor 120 in FIG. 1) with respect to the operation of the front surface camera module 306 may be provided to the image sensor portion 61 via the plurality of signal lines disposed across the third area 643. In an embodiment, the plurality of signal lines disposed across the third area 643 may support high-speed serial data communications, such as MIPI or differential signaling schemes. Some of the electromagnetic waves, which travels toward the front surface camera module 306 (in particular, the plurality of signal lines (e.g., MIPI paths)), among the electromagnetic waves radiated from the antenna radiator (e.g., the first conductive portion 601 or second conductive portion 602), may flow to the ground of the electronic device 200 via the first conductive pattern 51 and be absorbed by the ground of the electronic device 200. The second portion 512 of the first conductive pattern 51 electrically connected to the ground of the electronic device 200 may be overlapped with the front surface camera module 306 when viewed from the top of the rear surface 210B of the electronic device 200, and may substantially shield some of the electromagnetic waves, which travels toward the front surface camera module 306, among the electromagnetic waves radiated from the antenna radiator, from being transmitted or excited to the front surface camera module 306.

According to an embodiment, the second portion 512 of the first conductive pattern 51 may include a first pattern area 512a, a second pattern area 512b, and/or a third pattern area 512c. The first pattern area 512a may extend from the first area 641 of the camera module substrate 64 to the second area 642 of the camera module substrate 64 across the third area 643 of the camera module substrate 64, when viewed from the top of the rear surface 210B of the electronic device 200 (e.g., when viewed in the +z axis direction). When viewed from the top of the rear surface 210B of the electronic device 200, the first area 641 of the camera module substrate 64 may be positioned to be spaced apart from the second area 642 of the camera module substrate 64 in a direction (e.g., in the +x axis direction) from the fourth side surface portion 2034 of the lateral member 203 to the third side surface portion 2033 of the lateral member 203. The first pattern area 512a may extend from one end thereof to the other end thereof in a direction (e.g., in the +x axis direction) from the fourth side surface portion 2034 to the third side surface portion 2033, when viewed from the top of the rear surface 210B of the electronic device 200, and may be overlapped with the first area 641, the second area 642, and the third area 643 of the camera module substrate 64. The second pattern area 512b may extend from a first end thereof connected to the first pattern area 512a to a second end thereof, and the third pattern area 512c may be extended from a third end thereof connected to the first pattern area 512a to a fourth end thereof. When viewed from the top of the rear surface 210B of the electronic device 200, the second portion 512 may include a slit 513 provided by the first pattern area 512a, the second pattern area 512b, and the third pattern area 512c. The slit 513 may include an open slit end 514 provided with the second end of the second pattern area 512b and the fourth end of the third pattern area 512c spaced apart. When viewed from the top of the rear surface 210B of the electronic device 200, the first pattern area 512a may be positioned between the first side surface portion 2031 of the lateral member 203 and the open slit end 514. The first portion 511 may be extended from the third pattern area 512c of the second portion 512. In an embodiment, the shape of the first conductive pattern 51 according to the illustrated example may contribute to providing a radiation pattern that has no substantial effect on some of the electromagnetic waves, which travels toward a direction other than the direction toward the front surface camera module 306, among the electromagnetic waves radiated from the antenna radiator (e.g., the first conductive portion 601 or second conductive portion 602). Since the first conductive pattern 51 provides a radiation pattern that is capable of receiving (or absorbing) only some of the electromagnetic waves, which travel toward the front surface camera module 306, among the electromagnetic waves radiated from the antenna radiator, the antenna radiation performance or radio wave transmission and reception performance with respect to the antenna radiator is secured, thereby reducing the electromagnetic effects of the antenna radiator on the front surface camera module 306. In an embodiment, the shape of the first conductive pattern 51 according to the illustrated example may contribute to the front surface camera module 306 having a resonant length or electrical length that corresponds to a frequency of the noise (e.g., harmonic) generated by the front surface camera module 306 when the front surface camera module 306 is in operation. Although not illustrated, the shape of the first conductive pattern 51 may vary and is not limited to the illustrated example.

Figure 8:
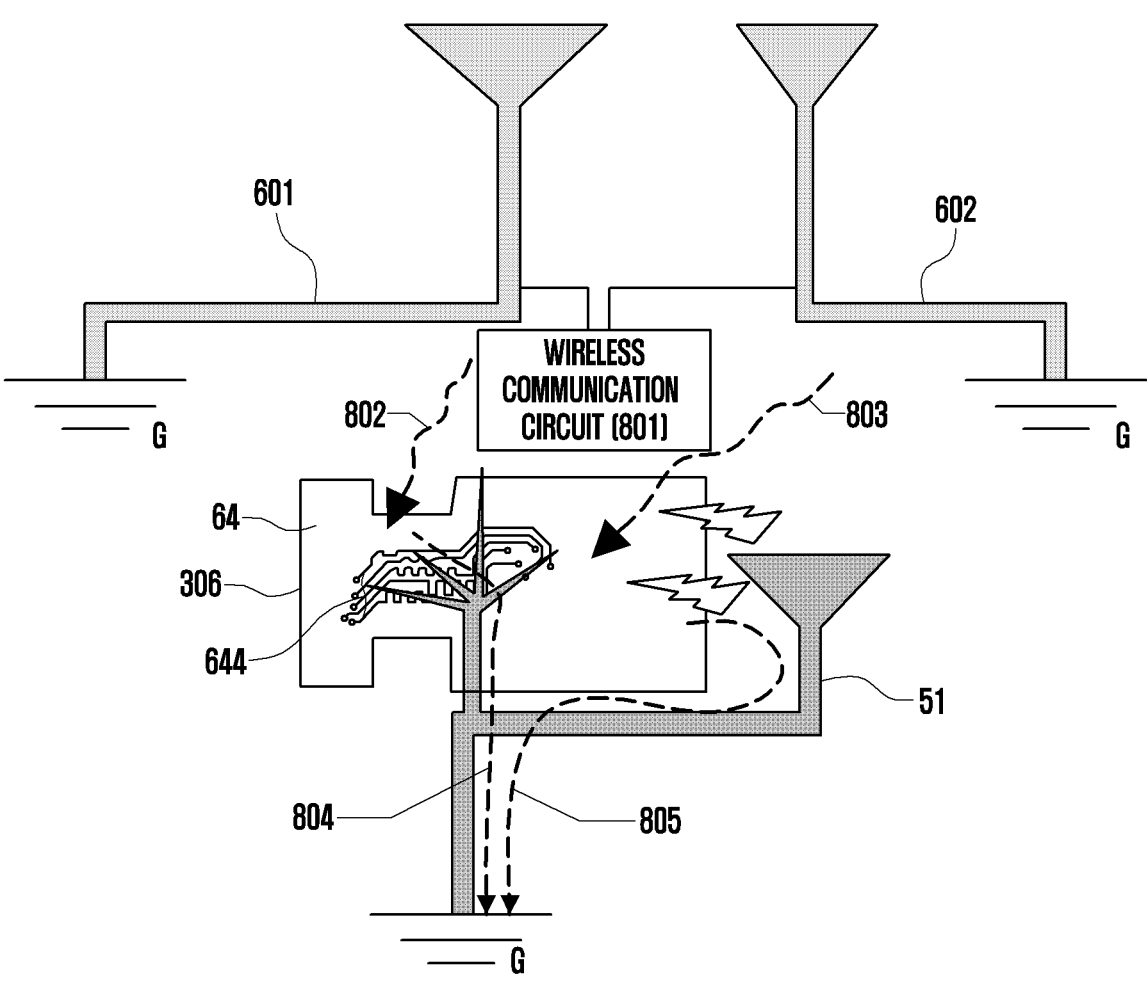
FIG. 8 is a block diagram illustrating the electronic device according to an embodiment of the disclosure.
Figure 9:
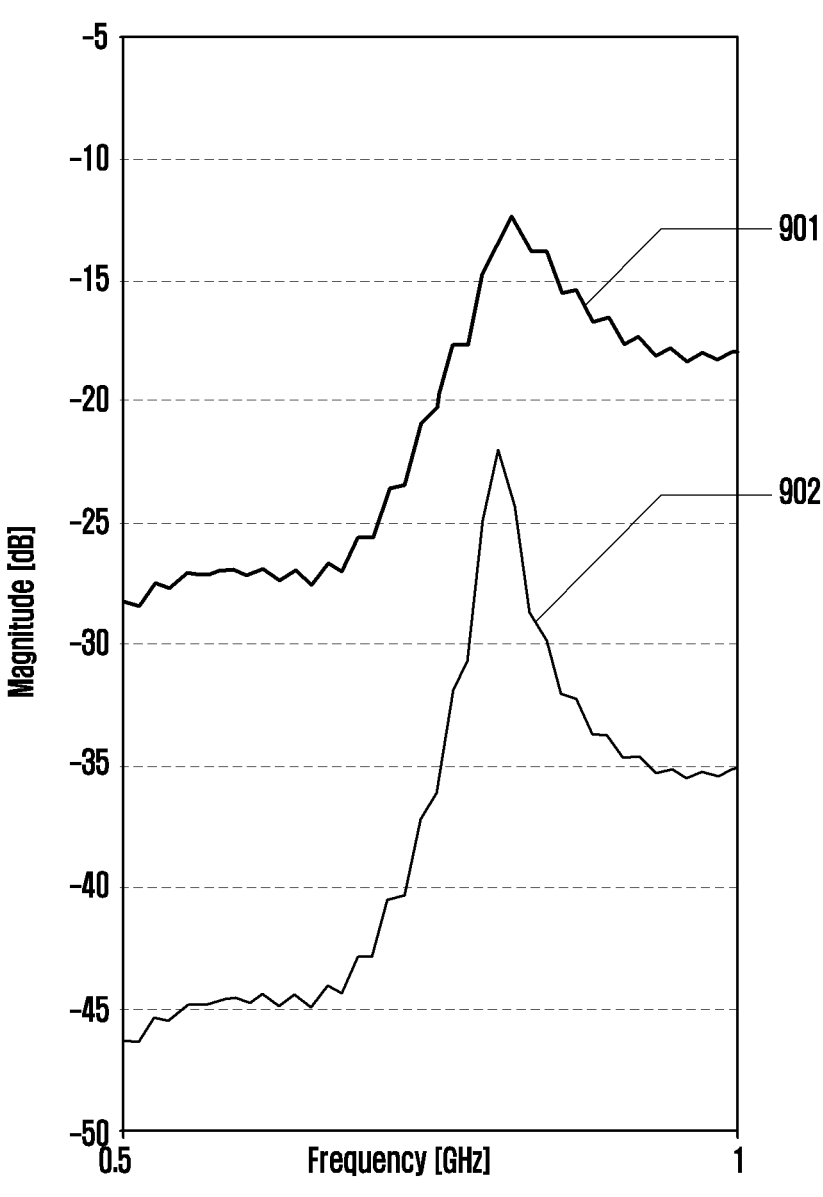
FIG. 9 is a graph illustrating electromagnetic property of a first conductive pattern according to an embodiment of the disclosure.

FIG. 8 is a block diagram illustrating an electronic device according to an embodiment of the disclosure. FIG. 9 is a graph illustrating electromagnetic properties of a first conductive pattern according to an embodiment of the disclosure.

Referring to FIG. 8, the electronic device 200 may include the first conductive portion 601, the second conductive portion 602, a wireless communication circuit 801 (e.g., the wireless communication module 192 in FIG. 1), a ground G, the front surface camera module 306, and/or the first conductive pattern 51. The first conductive portion 601 and the second conductive portion 602 may be electrically connected with the wireless communication circuit 801 and the ground G to serve as an antenna radiator. When the wireless communication circuit 801 provides an electromagnetic signal (or, an RF signal or radiated current) included in a selected or designated frequency band to the antenna radiator, the antenna radiator may radiate electromagnetic waves.

According to an embodiment, the first conductive pattern 51 electrically connected to the ground G may reduce the electromagnetic interference (e.g., electromagnetic noise) of the antenna radiation on the front surface camera module 306, thereby reducing degradation or malfunction of the front surface camera module 306. For example, some electromagnetic waves 802, which travel toward the front surface camera module 306 (or the plurality of signal lines 644), among the electromagnetic waves radiated from the first conductive portion 601, may flow through the first conductive pattern 51 to the ground G and be absorbed by the ground G (see reference numeral '804'). For example, some electromagnetic waves 803, which travels toward the front surface camera module 306 (or the plurality of signal lines 644), among the electromagnetic waves radiated from the second conductive portion 602, may flow through the first conductive pattern 51 to the ground G and be absorbed by the ground G (see reference numeral '805').

According to an embodiment, the first conductive pattern 51 electrically connected to the ground G may reduce the electromagnetic interference (e.g., electromagnetic noise) that the front surface camera module 306 has on the antenna radiator (e.g., the first conductive portion 601 and second conductive portion 602), thereby reducing degradation of antenna radiation performance or radio wave transmission and reception performance with respect to the first conductive portion 601 and the second conductive portion 602. For example, noise generated by the front surface camera module 306 when the front surface camera module 306 is in operation (e.g., a harmonic of about 48 MHz and a harmonic of about 51.5 MHz) may flow through the first conductive pattern 51 to the ground G and be absorbed by the ground G.

Referring to FIG. 9, a graph illustrating a result of a passive simulation of feeding the first portion 511 (see FIG. 6) to identify what electromagnetic properties (or antenna properties or radiation properties) the first conductive pattern 51 has, is depicted. The first conductive pattern 51 may provide electromagnetic characteristics in which resonant characteristics (see radiation efficiency indicated by reference numeral "901") corresponding to a frequency band (e.g., LB) in which the antenna radiator transmits or receives are relatively more enhanced than radiation characteristics (total radiation efficiency indicated by reference numeral "902") provided by the first conductive pattern 51. These electromagnetic properties may allow the first conductive pattern 51 to better operate as an absorber that may reduce the electromagnetic interference on the antenna radiator and reduce the electromagnetic interference of noise generated by the front surface camera module 306 on the antenna radiator.

Table 1 below shows antenna radiation performance (e.g., signal reception sensitivity) for the antenna radiator (e.g., the first conductive portion 601 or second conductive portion 602) in the electronic device 200 including the first conductive pattern 51. Table 1 below shows antenna radiation performance for the antenna radiator in a comparative example of the electronic device not including the first conductive pattern 51.

TABLE 1

| | Antenna radiation performance (or radio wave transmission and reception performance) [dB] |
|---|---|
| Electronic device 200 according to embodiment of the disclosure | 86.88 |
| Comparative example of electronic device | 80.53 |

With reference to Table 1, in the electronic device 200 according to an embodiment, the antenna radiation performance for the antenna radiator in a selected or designated frequency band (e.g., LB) may be approximately 86.88 dB when the front surface camera module 306 is in operation. In the comparative example of the electronic device, the antenna radiation performance for the antenna radiator in a selected or designated frequency band (e.g., LB) may be approximately 80.53 dB when the front surface camera module 306 is in operation. The electronic device 200 according to an embodiment may reduce the electromagnetic interference of the noise (e.g., harmonic) generated by the front surface camera module 306 on the antenna radiator by allowing the noise (e.g., harmonic) generated by the front surface camera module 306 to be absorbed by the ground of the electronic device 200 via the first conductive pattern 51, as compared to the comparative example of the electronic device.

Figure 10:
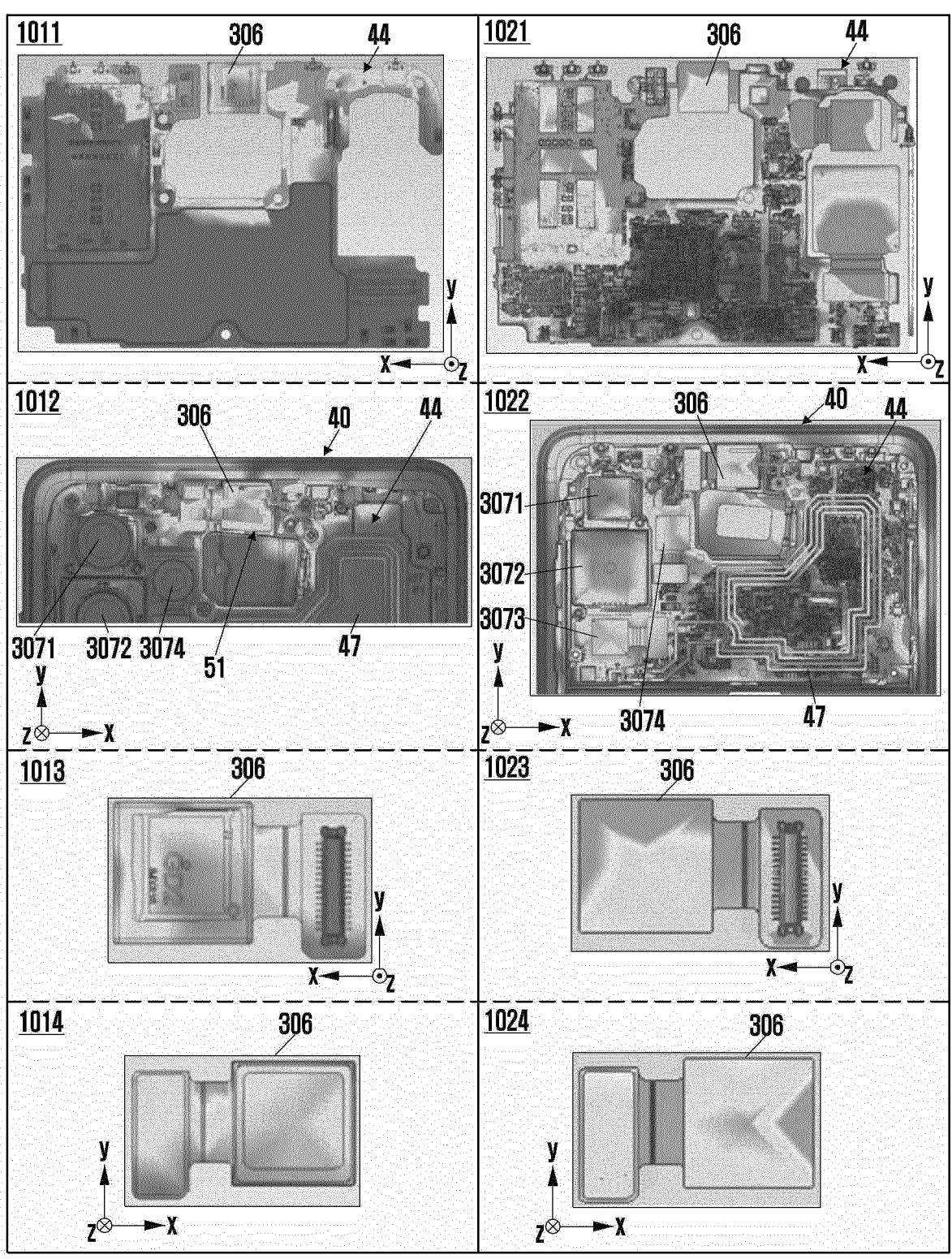
FIG. 10 illustrates electric field distribution (or Tx power field distribution) in the electronic device and a comparative example of the electronic device not including the first conductive pattern when providing an electromagnetic signal (or, RF signal or radiated current) to a first conductive portion (or, a first antenna radiator) according to an embodiment of the disclosure.

FIG. 10 illustrates electric field distributions (or Tx power field distributions) in an electronic device when providing an electromagnetic signal (or, RF signal or radiated current) to a first conductive portion (or the first antenna radiator), and electric field distributions in a comparative example of the electronic device that does not include the first conductive pattern according to an embodiment of the disclosure.

Referring to FIG. 10, the reference numeral "1011" indicates an electric field distribution in the first substrate assembly 44, which includes various electronic components such as the front surface camera module 306, with respect to the electronic device 200 according to an embodiment. The reference numeral "1012" illustrates an electric field distribution in the first substrate assembly 44, the front case 40, and the first conductive pattern 51, with respect to the electronic device 200 according to an embodiment. The reference numerals "1013" and "1014" indicate electric field distributions in the front surface camera module 306, with respect to the electronic device 200 according to an embodiment.

The reference numeral "1021" indicates an electric field distribution in the first substrate assembly 44, with respect to the comparative example of the electronic device. The reference numeral "1022" illustrates an electric field distribution in the first substrate assembly 44 and front case 40, with respect to the comparative example of the electronic device. The reference numerals "1023" and "1024" indicate electric field distributions in the front surface camera module 306, with respect to the comparative example of the electronic device.

The electronic device 200 according to an embodiment may reduce the electromagnetic interference of electromagnetic waves radiated from the first conductive portion (or the first antenna radiator) 601 on the front surface camera module 306, compared to the comparative example of the electronic device, because of the first conductive pattern 51 that is electrically connected to the ground of the electronic device 200 and operates as an ab7sorber.

Figure 11:
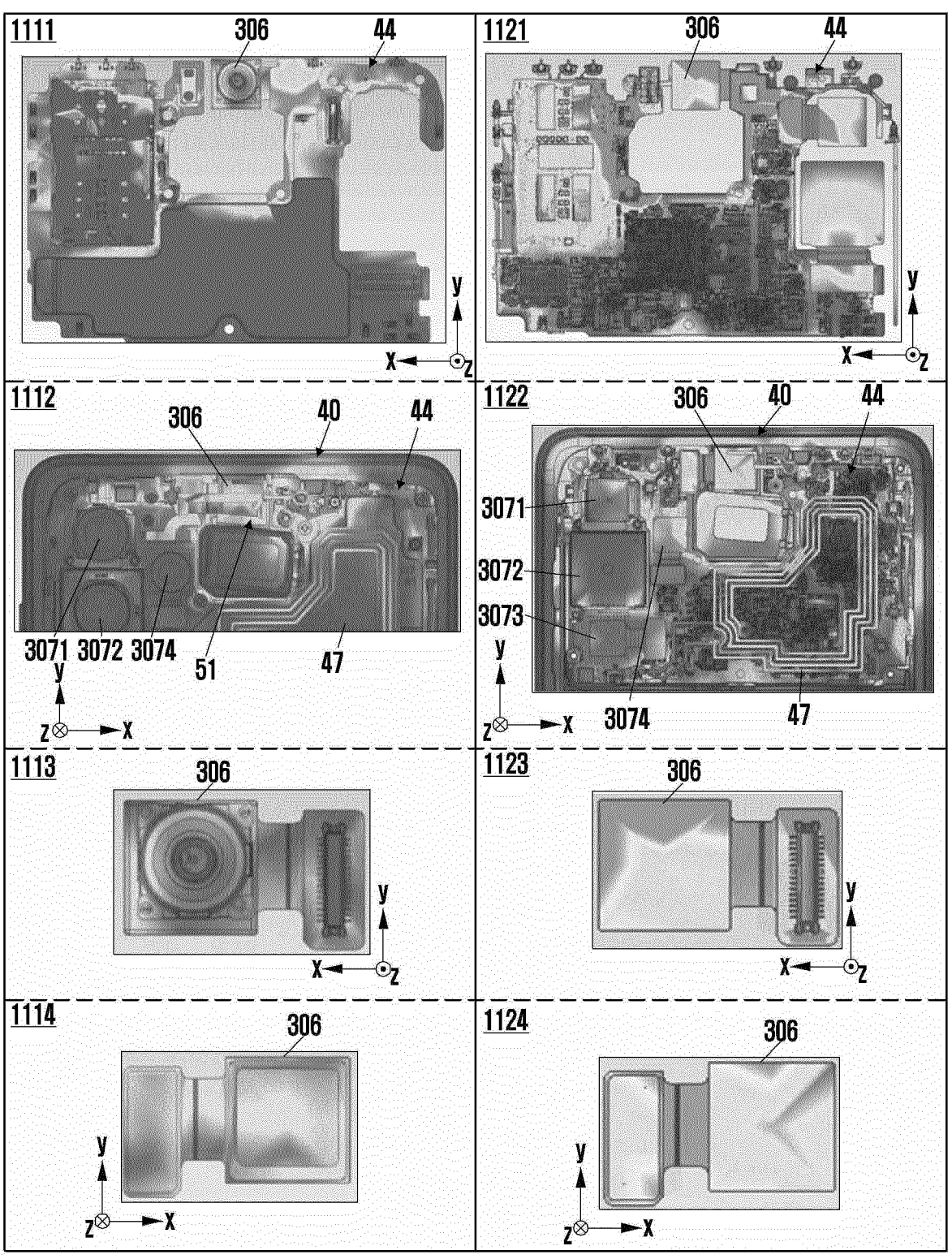
FIG. 11 illustrates electric field distribution (or Tx power field distribution) in the electronic device and a comparative example of the electronic device not including the first conductive pattern, when providing an electromagnetic signal (or RF signal or radiated current) to a second conductive portion (or the first antenna radiator) according to an embodiment of the disclosure.

FIG. 11 illustrates electric field distributions (or Tx power field distributions) in an electronic device and electric field distributions in a comparative example of the electronic device not including a first conductive pattern when providing an electromagnetic signal (or, RF signal or radiated current) to a second conductive portion (or, first antenna radiator) according to an embodiment of the disclosure.

Referring to FIG. 11, the reference numeral "1111" indicates an electric field distribution in the first substrate assembly 44, which includes various electronic components such as the front surface camera module 306, with respect to the electronic device 200 according to an embodiment. The reference numeral "1112" indicates an electric field distribution in the first substrate assembly 44, the front case 40, and the first conductive pattern 51, with respect to the electronic device 200 according to an embodiment. The reference numerals "1113" and "1114" indicate electric field distributions in the front surface camera module 306, with respect to the electronic device 200 according to an embodiment.

The reference numeral "1121" indicates an electric field distribution in the first substrate assembly 44, with respect to the comparative example of the electronic device. The reference numeral "1122" indicates an electric field distribution in the first substrate assembly 44 and the front case 40, with respect to the comparative example of the electronic device. The reference numerals "1123" and "1124" indicate an electric field distribution in the front surface camera module 306, with respect to the comparative example of the electronic device.

The electronic device 200, according to an embodiment may reduce the electromagnetic interference of electromagnetic waves radiated from the second conductive portion (or the second antenna radiator) 602 on the front surface camera module 306, compared to the comparative example of the electronic device, because of the first conductive pattern 51 that is electrically connected to the ground of the electronic device 200 and operates as an absorber.

Figure 12:
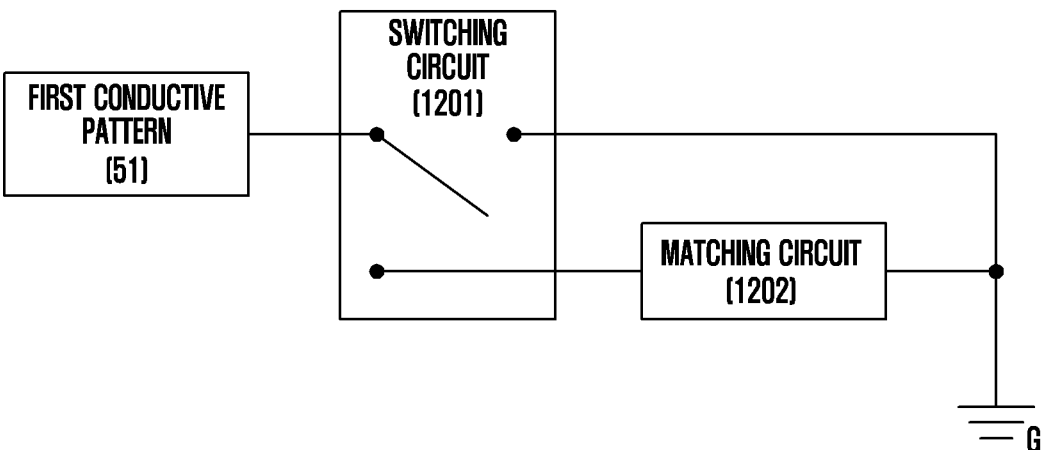
FIG. 12 is a block diagram illustrating a portion of the electronic device according to an embodiment of the disclosure.

FIG. 12 is a block diagram illustrating a portion of an electronic device according to an embodiment of the disclosure.

Referring to FIG. 12, the electronic device 200 may include the first conductive pattern 51, a switching circuit 1201, a matching circuit 1202, and/or the ground G.

According to an embodiment, the switching circuit 1201 and the matching circuit 1202 are circuit portions (or circuit areas) that electrically connect the first conductive pattern 51 and the ground G, and may be disposed on the first printed circuit board 441. The circuit area including the switching circuit 1201 and the matching circuit 1202 may connect the flexible conductive member 531 (see FIG. 6) and the first ground plane of the first printed circuit board 441 (see FIG. 6). The processor 120 may control the switching circuit 1201 on the basis of instructions stored in the memory 130 (see FIG. 1). The embodiment of FIG. 12 relates to a case where the first conductive pattern 51 may have an electromagnetic interference on the antenna radiator (e.g., the first conductive portion 601 or second conductive portion 602 of FIG. 8), such that the electrical interference may be adjusted to ensure signal quality according to an electric field condition (or communication state) in which the electronic device 200 is disposed.

According to an embodiment, in case that the electronic device 200 is positioned in a favorable environment in which the electric field condition is at a critical level (e.g., a strong electric field), the processor may control the switching circuit 1201 such that the first conductive pattern 51 and the ground G of the electronic device 200 are electrically connected. Although the first conductive pattern 51 may have the electromagnetic interference on the antenna radiator (e.g., the first conductive portion 601 or second conductive portion 602 in FIG. 8), the quality of the signal transmitted or received by the antenna radiator may be unlikely to be degraded because of the favorable environment in which the electric field condition is at a critical level. The first conductive pattern 51 electrically connected to the ground G of the electronic device 200 may reduce the electromagnetic interference caused by the antenna radiator on the front surface camera module 306, and the electromagnetic interference caused by the front surface camera module 306 on the antenna radiator.

According to an embodiment, in case that the electronic device 200 is positioned in an unfavorable environment in which the electric field condition is not at a critical level (e.g., a weak electric field), the processor may control the switching circuit 1201 such that the first conductive pattern 51 and the ground G of the electronic device 200 are electrically disconnected. When the first conductive pattern 51 is not electrically connected to the ground G of the electronic device 200 in an unfavorable environment in which the electric field condition is not at a critical level, the degradation of the antenna radiation performance or the radio wave transmission and reception performance with respect to the antenna radiator is reduced by the first conductive pattern 51, which may contribute to ensuring the quality of the signal transmitted or received by the antenna radiator.

According to various embodiments, in case that the electronic device 200 is positioned in an environment in which the electric field condition is below a critical level, the processor may control the switching circuit 1201 such that the first conductive pattern 51 is electrically connected to the ground G of the electronic device 200 via the matching circuit 1202. The matching circuit 1202 may be provided with at least one passive element, such as a capacitor, an inductor, or a resistor, or a combination thereof. The matching circuit 1202 may shift the resonant frequency of the first conductive pattern so as not to affect the resonance of the antenna radiator. When the first conductive pattern 51 is electrically connected to the ground G of the electronic device 200 via the matching circuit 1202 in an unfavorable environment in which the electric field condition is not at a critical level, the degradation of the antenna radiation performance or the radio wave transmission and reception performance with respect to the antenna radiator is reduced by the first conductive pattern 51, which may contribute to ensuring the quality of the signal transmitted or received by the antenna radiator.

According to various embodiments, the above-described way of reducing the electromagnetic interference between the front surface camera module 306 and the antenna radiator in the vicinity of the front surface camera module 306 by using the first conductive pattern 51 may be applied in the same or similar manner to a way of reducing the electromagnetic interference between various other electrical constituent elements other than the front surface camera module 306 and the antenna radiator in the vicinity of the various other electrical constituent elements.

According to an example embodiment of the disclosure, an electronic device (e.g., the electronic device 200 in FIG. 4) may include a housing (e.g., the housing 210 in FIG. 2). The housing may include a front surface plate (e.g., the front surface plate 201 in FIG. 4) configured to provide a front surface of the electronic device, a rear surface plate (e.g., the rear surface plate 202 in FIG. 4) configured to provide a rear surface of the electronic device, and a side surface portion (e.g., the lateral member 203 in FIG. 4) configured to provide a side surface of the electronic device. The electronic device may include a first support (e.g., the first supporting member 41 in FIG. 4) positioned between the front surface plate and the rear surface plate. The first support may be connected to the side surface portion. The electronic device may include a display positioned between the front surface plate and the first support (e.g., the display 301 in FIG. 4). The display may be visible through the front surface plate. The electronic device may include a wireless communication circuit (e.g., the wireless communication circuit 801 in FIG. 8) constituted to transmit or receive a signal in a selected or designated frequency band via an antenna radiator. The electronic device may include a camera module positioned between the first support and the rear surface plate (e.g., the front surface camera module 306 in FIG. 4). The camera module may include a camera or camera circuitry. The electronic device may include a conductive pattern (e.g., the first conductive pattern 51 in FIG. 4) positioned between the first support and the rear surface plate. The conductive pattern may be at least partially overlapped with the camera module when viewed from the top of the rear surface plate. The conductive pattern may be electrically connected to a ground of the electronic device. Some of electromagnetic waves, which travels toward the camera module, among the electromagnetic waves radiating from the antenna radiator, may flow to the ground through the conductive pattern.

According to an example embodiment of the disclosure, the antenna radiator may include a conductive portion (e.g., the first conductive portion 601 or second conductive portion 602 in FIG. 6) included in the side surface portion (e.g., the lateral member 203 in FIG. 4).

According to an example embodiment of the disclosure, the electronic device may further include a non-conductive second support (e.g., the non-conductive support 420 in FIG. 5) positioned between the first support (e.g., the first supporting member 41 in FIG. 4) and the rear surface plate (e.g., the rear surface plate 202 in FIG. 4). The camera module (e.g., the front surface camera module 306 in FIG. 4) may be positioned between the first support and the second support. The conductive pattern (e.g., the first conductive pattern 51 of FIG. 5) may be disposed on the second support and overlap with the camera module to face the camera module.

According to an example embodiment of the disclosure, the conductive pattern (e.g., the first conductive pattern 51 in FIG. 5) may be disposed on the second support (e.g., the non-conductive support 420 in FIG. 5) using LDS.

According to an example embodiment of the disclosure, the camera module may include an image sensor, a printed circuit board (e.g., the camera module substrate 64 in FIG. 6), and a connector (e.g., the connector 65 in FIG. 5). The printed circuit board may include a first area (e.g., the first area 641 in FIG. 4) on which the image sensor is disposed, a second area (e.g., the second area 642 in FIG. 4) on which the connector is disposed, and a third area (e.g., the third area 643 in FIG. 4) connecting the first area and the second area. The conductive pattern (e.g., the first conductive pattern 51 in FIG. 6) may include a portion thereof (e.g., the first pattern area 512a in FIG. 6) extending from the first area to the second area across the third area, when viewed from the top of the rear surface plate.

According to an example embodiment of the disclosure, the printed circuit board (e.g., the camera module substrate 64 in FIG. 6) may include a plurality of signal lines (e.g., the plurality of signal lines 644 in FIG. 8) extending from the first area (e.g., the first area 641 in FIG. 6) to the second area (e.g., the second area 642 in FIG. 6) across the third area (e.g., the third area 643 in FIG. 6). The conductive pattern (e.g., the first conductive pattern 51 in FIG. 6) may be at least partially overlapped with the signal wires when viewed from the top of the rear surface plate.

According to an example embodiment of the disclosure, the conductive pattern (e.g., the first conductive pattern 51 in FIG. 6) may include a slit (e.g., the slit 513 in FIG. 6) that includes an open slit end (e.g., the open slit end 514 in FIG. 6) when viewed from the top of the rear surface plate (e.g., the rear surface plate 202 in FIG. 4).

According to example embodiments of the disclosure, the antenna radiator may include the conductive portion (e.g., the first conductive portion 601 or second conductive portion 602 in FIG. 6) included in the side surface portion (e.g., the lateral member 203 in FIG. 4). The camera module may include the image sensor, the printed circuit board (e.g., the camera module substrate 64 in FIG. 6), and the connector (e.g., the connector 65 in FIG. 5). The printed circuit board may include a first area (e.g., the first area 641 in FIG. 4) on which the image sensor is disposed, a second area (e.g., the second area 642 in FIG. 4) on which the connector is disposed, and a third area (e.g., the third area 643 in FIG. 4) connecting the first area and the second area. The conductive pattern (e.g., the first conductive pattern 51 in FIG. 6) may include a pattern area (e.g., the first pattern area 512a in FIG. 6) extending from the first area to the second area across the third area, when viewed from the top of the rear surface plate. The pattern area may be positioned between the conductive portion of the side surface portion and the open slit end (e.g., the open slit end 514 in FIG. 6), when viewed from the top of the rear surface plate.

According to an example embodiment of the disclosure, the conductive pattern may include a first pattern area (e.g., the first pattern area 512a in FIG. 6), a second pattern area (e.g., the second pattern area 512b in FIG. 6), and a third pattern area (e.g., the third pattern area 512c in FIG. 6). The first pattern area may extend parallel to the second pattern area and the third pattern area. A first length of the first pattern area is longer than a combination of a second length of the second pattern area and a third length of the third pattern area. The open slit end (e.g., the open slit end 514 in FIG. 6) extends from one end of the second pattern area to one end of the third pattern area.

According to example embodiments of the disclosure, the antenna radiator may include the conductive portion (e.g., the first conductive portion 601 or second conductive portion 602 in FIG. 6) included in the side surface portion (e.g., the lateral member 203 in FIG. 4). The conductive pattern (e.g., the first conductive pattern 51 in FIG. 6) may have an electrical length corresponding to a frequency of a signal transmitted or received through the conductive portion of the side surface portion, or an electrical length corresponding to a frequency band in which the signal is included.

According to an example embodiment of the disclosure, the conductive pattern (e.g., the first conductive pattern 51 in FIG. 6) may have an electrical length corresponding to a frequency of a harmonic generated by the camera module, or an electrical length corresponding to a frequency band in which the harmonic is included.

According to an example embodiment of the disclosure, the electronic device may further include a printed circuit board (e.g., the first printed circuit board 441 in FIG. 4) positioned between the first support (e.g., the first supporting member 41 in FIG. 4) and the rear surface plate (e.g., the rear surface plate 202 in FIG. 4). The printed circuit board may be disposed on the first support. The wireless communication circuit may be disposed on the printed circuit board, and the camera module may be electrically connected to the printed circuit board. The printed circuit board may provide a ground plane (e.g., the first ground plane) included in the ground. The conductive pattern (e.g., the first conductive pattern 51 in FIG. 5) may be electrically connected to the ground plane via a flexible conductor (e.g., the flexible conductive member 531 in FIG. 6) or conductive adhesive material positioned between the conductive pattern and the printed circuit board.

According to an example embodiment of the disclosure, the electronic device may further include a circuit portion (e.g., the switching circuit 1201 in FIG. 12) electrically connecting the conductive pattern (e.g., the first conductive pattern 51 in FIG. 12) and the ground (e.g., the ground G in FIG. 12). The circuit portion may electrically connect the conductive pattern and the ground, or electrically disconnect the conductive pattern and the ground, according to a control of a processor included in the electronic device.

According to an example embodiment of the disclosure, the camera module may generate an electrical signal from external light that passes through the front surface plate and reaches the camera module.

According to an example embodiment of the disclosure, the camera circuitry includes a front surface camera module adjacent to the front surface of the electronic device. Noise generated by the front surface camera module flows through the conductive pattern (e.g., the conductive pattern 51 in FIG. 6) to the ground of the electronic device to be absorbed by the ground.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a housing;
a first support inside the housing;
a display disposed in a front side of the housing;
a wireless communication circuit configured to transmit or receive, through an antenna, a signal in a selected or designated frequency band;
camera circuitry inside the housing; and
a conductive pattern positioned between the first support and a rear side of the housing and at least partially overlapping with the camera circuitry when viewed from above the rear side of the housing, the conductive pattern being electrically connected to a ground of the electronic device such that the conductive pattern prevents electromagnetic waves radiating from the antenna from reaching the camera circuitry,
wherein the conductive pattern comprises a slit comprising an open slit,
wherein the camera circuitry comprises an image sensor, a printed circuit board, and a connector, wherein the printed circuit board comprises:

a first area on which the image sensor is disposed;

a second area on which the connector is disposed; and a third area connecting the first area and the second area, wherein the conductive pattern comprises a first pattern area extending from the first area to the second area across the third area, and wherein the first pattern area is positioned between the antenna and the open slit when viewed from above the rear side of the housing.

2. The electronic device of claim 1, further comprising:

a non-conductive second support positioned between the first support and the rear side of the housing, wherein the camera circuitry is positioned between the first support and the non-conductive second support, and wherein the conductive pattern is disposed on the non-conductive second support and overlapped with the camera circuitry to face the camera circuitry.

3. The electronic device of claim 2, wherein the conductive pattern is disposed on the non-conductive second support through laser direct structuring (LDS).

4. The electronic device of claim 1, wherein the printed circuit board comprises a plurality of signal lines extending from the first area to the second area through the third area, and wherein the conductive pattern is at least partially overlapped with the signal lines when viewed from above the rear side of the housing.

5. The electronic device of claim 1, wherein the antenna comprises a conductive portion positioned in a side portion of the housing.

6. The electronic device of claim 1, wherein the conductive pattern has at least one of an electrical length corresponding to a frequency of a signal transmitted or received through the antenna or an electrical length corresponding to a frequency band in which the signal is included.

7. The electronic device of claim 1, wherein the conductive pattern has at least one of an electrical length corresponding to a frequency of a harmonic generated from the camera circuitry, or an electrical length corresponding to a frequency band in which the harmonic is included.

8. The electronic device of claim 1, further comprising:

a second printed circuit board disposed on the first support between the first support and the rear side of the housing, wherein the wireless communication circuit is disposed on the second printed circuit board, wherein the camera circuitry is electrically connected with the second printed circuit board, wherein the second printed circuit board has a ground plane included in the ground, and wherein the conductive pattern is electrically connected to the ground plane through a flexible conductor or conductive adhesive material positioned between the conductive pattern and the printed circuit board.

9. The electronic device of claim 1, further comprising:

a circuit portion electrically connecting the conductive pattern and the ground, wherein the circuit portion electrically connects the conductive pattern and the ground, or electrically disconnects the conductive pattern and the ground, based on a control of a processor included in the electronic device.

10. The electronic device of claim 1, wherein the camera circuitry generates an electrical signal from external light passing through the front side of the housing and reaching the camera circuitry.

11. The electronic device of claim 1, wherein the camera circuitry includes front surface camera circuitry adjacent to the front side of the housing, and wherein noise generated by the front surface camera circuitry flows through the conductive pattern to the ground of the electronic device to be absorbed by the ground.

12. The electronic device of claim 1, wherein the conductive pattern further comprises a second pattern area and a third pattern area, wherein the first pattern area extends parallel to the second pattern area and the third pattern area, and wherein a first length of the first pattern area is longer than a combination of a second length of the second pattern area and a third length of the third pattern area.

13. The electronic device of claim 12, wherein the open slit extends from one end of the second pattern area to one end of the third pattern area.

* * * * *